(12) United States Patent
Forrest et al.

(10) Patent No.: US 9,793,481 B2
(45) Date of Patent: Oct. 17, 2017

(54) PATTERNING BY STAMPED METAL RESIST

(75) Inventors: Stephen R. Forrest, Ann Arbor, MI (US); Momchil T. Mihnev, Ann Arbor, MI (US); Andre D. Taylor, Ann Arbor, MI (US); Xin Xu, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 599 days.

(21) Appl. No.: 12/331,062

(22) Filed: Dec. 9, 2008

(65) Prior Publication Data

US 2010/0080914 A1    Apr. 1, 2010

Related U.S. Application Data

(60) Provisional application No. 61/194,895, filed on Oct. 1, 2008.

(51) Int. Cl.
*H01L 51/00* (2006.01)
(52) U.S. Cl.
CPC .................. *H01L 51/0021* (2013.01)
(58) Field of Classification Search
CPC ..................................... H01L 51/0021
USPC .................................. 427/259, 264
See application file for complete search history.

(56) References Cited

U.S. PATENT DOCUMENTS 3,221,301 A * 11/1965 Moyroud ............... B41B 25/00
                                                              382/213
7,497,916 B2 * 3/2009 Hayashi et al. ............... 156/64
2004/0121568 A1 * 6/2004 Kim et al. .................. 438/584
2007/0120135 A1 * 5/2007 Soules et al. ............... 257/98
2008/0202673 A1    8/2008 Forrest et al.

FOREIGN PATENT DOCUMENTS

WO    WO 2006061255 A1 * 6/2006

OTHER PUBLICATIONS

Xu et al. "Organic photodetector focal plane arrays fabricated on hemispherical substrates by three-dimensional stamping", Laser and Electro-Optics Society, 2007, pp. 578-579.*
Kim, C., et al., "Micropatterning of organic electronic devices by cold-welding", Science, 2000. 288(5467): p. 831-833.
H. O. Jacobs et al., "Submicrometer patterning of charge in thin-film electrets" Science 291, 1763 (2001).
Y. Xia et al., "Soft Lithography" Angew. Chem. Int. Ed. 37, 550 (1998).
S. M. Miller et al., "Direct printing of polymer microstructures on flat and spherical surfaces using a letterpress technique", J. Vac. Sci. Technol. B 20, 2320 (2002).

(Continued)

*Primary Examiner* — Alex A Rolland
(74) *Attorney, Agent, or Firm* — Riverside Law LLP

(57) ABSTRACT

A method is provided. A first layer is provided over a substrate, the first layer comprising a first material. A patterned second layer is applied over the first layer via stamping. The second layer comprising a second material. The second layer covers a first portion of the first layer, and does not cover a second portion of the first layer. The second portion of the first layer is removed via a subtractive process while the first portion of the first layer is protected from removal by the patterned second layer.

26 Claims, 15 Drawing Sheets

(56) References Cited

OTHER PUBLICATIONS

C. Kim et al., "Nanolithography based on patterned metal transfer and its application to organic electronic devices", Appl. Phys. Lett. 80, 4051 (2002).

C. Kim et al., "Fabrication of organic light-emitting devices by low-pressure cold welding", Adv. Mater. 15(6), 541-545 (2003).

Xu et al. "Direct transfer pattering on three dimensionally deformed surfaces at micrometer resolutions and its application to hemispherical focal plane detector arrays", Organic Electronics vol. 9, No. 6 (2008), pp. 1122-1126.

N. Bowden et al., "Spontaneous formation of ordered structures in thin films of metals supported on an elastomeric polymer", Nature 393, 146(1998).

Breen, T.L., et al. "Patterning indium tin oxide and indium zinc oxide using microcontact printing and wet etching", Langmuir, 2002. 18(1): p. 194-197.

Mohri, M., et al. Plasma-Etching of Ito Thin-Films Using a Ch4/H2 Gas-Mixture, Japanese Journal of Applied Physics Part 2-Letters, 1990.29(10): pp. L1932-L1935.

Scholten, M. et al., "On the Mechanism of Ito—Etching—the Specificity of Halogen Acids", Journal of the Electrochemical Society, 1993. 140(2): p. 471-475.

Tsai, T.R.et al., "Wet etching mechanisms of ITO films in oxalic acid", Microelectronic Engineering, 2006. 83(3): pp. 536-541.

P. Peumans et al., "Very-high-efficiency double-heterostructure copper phthalocyanine/c60 photovoltaic cells", Appl. Phys. Lett. 79, 126(2001).

U.S. Appl. No. 10/387,925, filed Mar. 13, 2003.

The International Search Report and Written Opinion corresponding to the PCT/US2009/059205 application dated Feb. 2, 2010.

Haas et al., Mechanical Reliability of Nanoscaled Inkbased Ag Films on Flexible Substrates, 1 pg.

Li et al., Stretchability of Thin Metal Films on Elastomer Substrates, American Institute of Physics, Applied Physics Letters, vol. 85, No. 16, Oct. 18, 2004, pp. 3435-3437.

Rebros et al. UV-Inks, Substrates and Wetting, Proceedings of the 2006 TAPPI Coating and Graphic Arts Conference, Apr. 24-27, 2006, Atlanta, 7 pp.

\* cited by examiner

PATTERNING BY STAMPED METAL RESIST

This application claims priority to U.S. Provisional Application 61/194,895, filed on Oct. 1, 2008, which is incorporated by reference in its entirety.

The invention was made with government support under DAAB07-01-D-G602, awarded by Army Night Vision. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to device fabrication, and more specifically to the use of a stamp for device fabrication.

BACKGROUND

Metals, organics, and other solid materials may be deposited on a flexible substrate, which is then deformed into a desired configuration after the material has been deposited. For example, a metal electrode may be deposited on a flexible substrate for use in an organic light emitting device. However, such a substrate not allow for arbitrarily-shaped devices to be formed since the flexible substrate and/or any layers deposited on the substrate may be damaged or destroyed if the substrate is deformed beyond a certain point. For example, a flexible indium tin oxide (ITO) substrate can be rolled, but can not be formed into a dome or other ellipsoidal shape without damaging the substrate or layers on the substrate. Deposition of material onto a non-planar substrate would be useful for a variety of applications, including organic light emitting and photosensitive devices and other optical applications.

SUMMARY OF THE INVENTION

A method is provided. A first layer is provided over a substrate, the first layer comprising a first material. A patterned second layer is applied over the first layer via stamping. The second layer comprising a second material. The second layer covers a first portion of the first layer, and does not cover a second portion of the first layer. The second portion of the first layer is removed via a subtractive process while the first portion of the first layer is protected from removal by the patterned second layer.

The use of a strike layer to facilitate application of the patterned second layer is preferred.

Any of a number of materials may be used in the first layer, including metals, semiconductor oxides, other materials, and combinations thereof. Transparent semiconductor oxides are preferred.

The methods disclosed herein may be used on both planar and non-planar substrates. However, while there may be alternative methods available for use on a planar substrate, the methods disclosed herein may be the best available for use on a non-planar substrate, particularly for materials such as semiconductor oxides. Non-planar surfaces having two-dimensional curvature may be particularly well-suited for use with the methods disclosed herein, because alternative methods may be particularly limited for use with such surfaces.

Preferably, the entire patterning method, including the application of a second layer using an elastomeric stamp, is performed at a temperature of 20 C to 30 C. Preferably, at least the application of a second layer using an elastomeric stamp is performed at a temperature of 20 C to 30 C.

Preferably, the first portion of the first layer is removed via a dry process.

A method for patterning a first layer is provided. The first layer is provided over a substrate, the first layer comprising a transparent conductive oxide. A strike layer comprising a metal is deposited on the first layer. A patterned second layer is applied on the strike layer via stamping, the second layer comprising the metal, such that the patterned second layer covers a first portion of the strike layer and the first layer, and does not cover a second portion of the strike layer and the first layer. The second portion of the strike layer is removed. The second portion of the first layer is also removed, via a subtractive process while the first portion of the first layer is protected from removal by the patterned second layer. After the second portion of the first layer is removed, the patterned second layer is removed, such that the first portion of the first layer remains.

DETAILED DESCRIPTION

Figure 1:
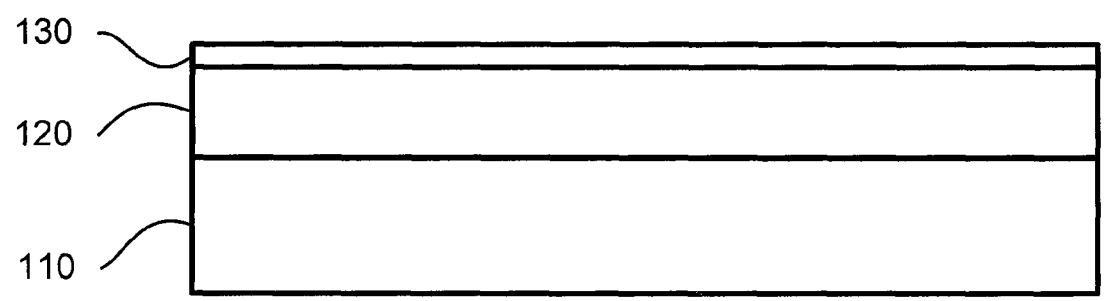
FIG. 1 shows a planar substrate having an electrode and a strike layer disposed thereon

For many types of devices, it is desirable to use electrodes made of semiconductor oxides. These materials have a combination of conductivity and transparency that is particularly desirable for opto-electronic devices, such as photodetectors, solar cells and light emitting devices. Indium tin oxide is a common semiconductor oxide used in this manner, although there are many others, including zinc tin oxide and indium zinc tin oxide.

While methods of patterning semiconductor oxides are known, these methods may not be well suited for use on a non-planar surface. These methods may be particularly unsuited for use on surfaces having two-dimensional curvature, and non-developable surfaces, i.e., surfaces that can not be formed from a planar surface without some stretching or compression of the surface in the plane of the surface. For example, a cylinder is not non-developable because it can be formed by rolling a flat surface, which does not require stretching. However, a sphere is non-developable because it can not be formed from a flat surface without some stretching or compression in the direction of the surface.

Patterning based on room temperature, direct transfer of materials (i.e. cold welding) attracts considerable attention due to its potential applications for the rapid fabrication of large area, low cost electronics. Therefore it has been used to pattern organic electronic devices and circuits. See, C. Kim, P. E. Burrows, S. R. Forrest, Science 288, 831(2000); H. O, Jacobs and G. M. Whitesides, Science 291, 1763 (2001); Y. Xia and G. M. Whitesides, Angew. Chem. Int. Ed. 37, 550(1998); S. M. Miller, S. M. Troian, S. Wagner, J. Vac. Sci. Technol. B 20, 2320(2002); C. Kim, M. Shtein, S. R. Forrest, Appl. Phys. Lett. 80, 4051(2002); C. Kim and S. R. Forrest, Adv. Mater. 15, 541(2003). Additionally, application of soft and elastomeric stamps instead of rigid stamps, such as poly-dimethyl siloxane (PDMS) stamps, allows for transfer at very low pressures with the capability for high resolution patterning. See C. Kim, M. Shtein, S. R. Forrest, Appl. Phys. Lett. 80, 4051(2002); C. Kim and S. R. Forrest, Adv. Mater. 15, 541(2003). Previously, a 10 kilo-pixel organic photodetector focal plane array has been fabricated on a 1 cm radius plastic hemisphere by three dimensional stamping method. See, X. Xu, M. Davanco, X. Qi, S. R. Forrest, Organic Electronics (2008), DOI: 10.1016/j.orgel.2008.07.011. In that work, a layer of 15 nm thick Au was patterned as the semi-transparent anode which leads to low external quantum efficiency due to the low absorption efficiency.

However, semiconductor oxides are generally somewhat brittle, and semiconductor oxide layers transferred via stamping may not perform as well as desired. Some methods of stamping onto a non-planar surface involve deforming a planar stamp into the non-planar configuration after the material to be transferred is already present on the stamp. This deformation may be readily achieved for many combinations of materials, such as metals on polymer stamps such as PDMS, because it is believed that the metal does not adhere strongly to the stamp, and may be able to slip relative to the stamp and/or deform just a little to accommodate stamp deformation without adversely affecting the desired pattern. However, other materials, such as transparent semiconductor oxides, may adhere strongly to some desirable stamp materials such as PDMS and other polymers, such that they are unable to slip. Transparent semiconductor oxides also tend to be brittle, and unable to deform slightly to accommodate a change from planar to non-planar configurations where the deformation requires local strain, i.e., deforming to a surface having 2-D curvature. Thus, direct stamping of patterned semiconductor oxides may have low yield in many situations.

In addition, it may be difficult to directly transfer thick layers from a stamp to an underlying substrate. This is due in part to wrinkling of the stamp during deposition, which has been shown for thick metal layers, see N. Bowden, S. Brittain, A. G. Evans, J. W. Hutchinson and G. M. Whitesides, Nature 393, 146(1998). However, thick patterned layers are desirable in many circumstances. For example, the resistance of metal films desirably decreases as they become thicker.

In this work, a new method of patterning capability via stamping is provided that is readily used for transparent semiconductor oxide materials, such as transparent ITO, on both planar and hemispherical surfaces. The method is also readily used to pattern thick layers. By using this technique, passive matrix organic photodetector focal plane arrays (FPA) have been demonstrated with increased responsivity on a flat plastic substrate and on a 1 cm radius hemispherical surface. The technique may be used for other types of materials and devices.

A method of patterning that uses a mask applied via stamping is disclosed. The method may be particularly useful for patterning semiconductor oxide layers on a non-planar surface, but may also be used in other contexts, including planar surfaces and for the patterning of materials other than semiconductor oxides.

As used herein, "stamping" refers to the transfer of material, preferably patterned, from a stamp to a substrate. For the transfer of metal, cold welding to a "strike layer" on the substrate is a preferred mechanism for such transfer. Stamping is disclosed in a variety of publications, including C. Kim, P. E. Burrows, S. R. Forrest, Science 288, 831 (2000); H. O, Jacobs and G. M. Whitesides, Science 291, 1763 (2001); Y. Xia and G. M. Whitesides, Angew. Chem. Int. Ed. 37, 550(1998); S. M. Miller, S. M. Troian, S. Wagner, J. Vac. Sci. Technol. B 20, 2320(2002); C. Kim, M. Shtein, S. R. Forrest, Appl. Phys. Lett. 80, 4051(2002); C. Kim and S. R. Forrest, Adv. Mater. 15, 541(2003).

As used herein, the term "over" used to describe layers allows for intervening layers. If a first layer is "over" a second layer, there may be a third layer in between.

As used herein, the terms "remove" and "remain" as used to describe portions of a layer patterned via etching through a patterned mask allow for minor variations at the edges of the mask, as is known with respect to etching technology. That is, if an etching process is described as "removing" portions of a layer exposed through a mask, such that other portions "remain" it is understood that the etching process may be isotropic or anisotropic, and that the "remaining" portion of the patterned layer may have some small variations from the mask due to anisotropy of the etching process.

An array of photodetectors disposed on a non-planar surface, such as an ellipsoidal surface, may be used to create a focal plane array of photodetectors. A focal plane array of photodetectors is particularly desirable because it replicates efficiencies found in the human eye. Consumer applications incorporating a focal plane array of photodetectors may particularly benefit from patterning methods disclosed herein.

A method is provided. A first layer is provided over a substrate, the first layer comprising a first material. A patterned second layer is applied over the first layer via stamping. The second layer comprising a second material. The second layer covers a first portion of the first layer, and does not cover a second portion of the first layer. The second portion of the first layer is removed via a subtractive process while the first portion of the first layer is protected from removal by the patterned second layer.

When the second layer is applied over the first layer via stamping, any of various refinements available for stamping may be used. For example, a strike layer may be applied on the first layer prior to stamping, such that the patterned second layer is applied on the strike layer. This allows for good adhesion of the patterned second layer during stamping. For example, a strike layer of a material that readily cold welds to the second material may be used. The strike layer may be made of the second material. A strike layer may generally not be patterned to the same degree as the mask, although there may be some rough patterning of the strike layer, for example around the periphery of a device or array of devices.

Once the second layer is applied, portions of the strike layer not covered by the patterned second layer may be removed via a subtractive process. For a gold strike layer, for example, an argon plasma etch may be used to remove the strike layer. While the process used to remove these portions of the strike layer may also attack the second layer, particularly where the strike layer and the second layer are made of the same material, the second layer is generally significantly thicker than the strike layer such that exposed portions of the strike layer may be removed while leaving most of the second layer in place.

The patterned second layer may be referred to as a mask. Any material may be used for the mask that can be transferred via stamping, and that can sufficiently withstand an etching process to allow for selective removal of the first layer in areas not covered by the mask. Preferred materials for the second material include metals, because of the ease with which metals may be transferred via stamping, and because of the availability of etchants such as oxalic acid that preferentially etch semiconductor oxides such as ITO as compared to metals such as gold. Gold is a preferred specific material for the second material. When used as a mask, the patterned second layer may be used to selectively expose the first layer to a subtractive process, such as etching, to remove the second portion of the first layer. Soft metals and noble metals, such as gold, platinum, silver, copper, brass and others, are one group of materials preferred for use in the strike layer and for the patterned second layer, because a metallic bond may be formed at relatively low pressure. Other examples of mask materials include oxides, such as $SiO$, $Al_2O_3$, $MoO_3$, and ITO (the latter for situations where the first layer is not also ITO). In the case of oxides, electrostatic forces are one mechanism that may be useful for transfer from the stamp to the substrate. Other examples of mask materials include polymers, including many known and commercially available photoresist materials. But, any material set that will result in the transfer of the patterned second layer due to stamping may be used. For transfer, a material should adhere more strongly to the substrate (with optional strike layer) than to the stamp. Also, the mask material should be such that the underlying layer may be removed where it is exposed through the mask with subtractive etching. Put another way, the mask (the patterned second layer) and the first layer should be made of different materials, and there should be "material contrast" between the two materials, which means that there is a subtractive process that removes one material (that of the first layer) more readily than the other material. Many material combinations having these properties may be readily identified.

Examples of etching processes include wet etching, dry etching such as plasma etching, reactive ion etching, and many others. Etchants may be liquid, gas or plasma. Etchants generally include materials that preferentially attack the material of the first layer over that of the second layer. Exemplary etchants include oxalic acid, HCl, bromine methanol, and others.

Specific examples of first layer, patterned second layer, and etchant/removal processes include: Al patterned through a gold mask using HCl as an etchant; and indium phosphate patterned through a gold mask using bromine methanol as an etchant. Oxalic acid may be used to etch many semiconductor oxides, such as indium tin oxide, indium zinc oxide, and indium zinc tin oxide, where metals are used for a mask, such as Au, Ag, Al and Pt. Many other combinations are readily apparent.

After the second portion of the first layer is removed, it may be desirable to remove the patterned second layer, such that the second portion of the first layer remains. This is preferably accomplished by a subtractive process that preferentially removes the material of the second layer. For example, a gold etchant, such as Gold Etchant TFA, available from Transene Company, Inc. of Maine, USA, may be used to remove gold from ITO. If the second layer does not adversely affect the final product, it may be left in place. However, many materials desirable for use as a mask, such as gold, may not have the combination of favorable properties of the material of the first layer, such as the combined transparency and conductivity of indium tin oxide.

Any of a number of materials may be used in the first layer, including metals, semiconductor oxides, other materials, and combinations thereof.

The disclosed methods are particularly preferred for patterning layers via stamping, where the layer to be patterned is too thick to be directly stamped. Because the first layer, which is patterned, is directly deposited and not transferred via stamp, the thickness of the first layer is not limited by stamping considerations. A thinner patterned second layer may be readily transferred via stamp and used as a mask to pattern the first layer. The disclosed methods may also be preferred where there are other issues with a layer patterned via direct stamping, such as poor adhesion or undesirable damage during stamping.

The disclosed methods are particularly preferred where the first material may be brittle, may not adhere well during stamping, or has some other issue. Methods disclosed herein allow for the first layer to be provided on any substrate, including non-planar substrate, by any of a wide variety of deposition methods. Such deposition methods generally do not involve patterning at the resolution of the mask, although there may be some macro scale patterning, for example at the resolution of the overall array of devices, which may be achieved more easily. Examples of such deposition methods include sputtering, vapor deposition, chemical vapor deposition, plasma enhanced chemical vapor deposition, solution processing, and electroplating. Because there is flexibility in choosing the method used to provide the first layer, a method which results in favorable properties may be used.

Preferred first materials for use in the first layer include transparent conductive oxides, due to their brittleness and strong adhesion to some desirable stamp materials. Indium tin oxide is particularly preferred. However, a wide variety of other materials may be used in the first layer, and patterned via methods disclosed herein. Examples include metals such as platinum, silver, palladium, copper, silver and aluminum, semiconductors such as amorphous silicon, and many others. Any material that can be patterned by using a suitable mask and subtractive process may be used.

The methods disclosed herein may be used on both planar and non-planar substrates. However, while there may be alternative methods available for use on a planar substrate, the methods disclosed herein may be the best available for use on a non-planar substrate, particularly for materials such as semiconductor oxides. Non-planar surfaces having two-dimensional curvature may be particularly well-suited for use with the methods disclosed herein, because alternative methods may be particularly limited for use with such surfaces.

One way to achieve a non-planar substrate is through the use of a vacuum device, and a material that may be deformed by the vacuum device and subsequently thermoset. The use of a vacuum device in this way is described in U.S. Patent Publication 2008-0202673, which is incorporated by reference. PETg is a preferred substrate material. Many other substrate materials and methods may be used to obtain a non-planar substrate.

Preferably, the patterned second layer is applied using an elastomeric stamp. PDMS is a preferred material for an elastomeric stamp. A method such as that disclosed in U.S. Patent Publication 2008-0202673 may be used to transfer a patterned layer from an elastomeric stamp to a curved substrate using a vacuum device. Other stamp materials and transfer methods may be used. Moldable plastics are preferred stamp materials due to ease of use. Preferably, the stamp material is elastomeric. h-PDMS and silicone are two other examples of stamp materials that may be readily patterned.

Preferably, the entire patterning method, including the application of a second layer using an elastomeric stamp, is performed at a temperature of 20 C to 30 C. Preferably, at least the application of a second layer using an elastomeric stamp is performed at a temperature of 20 C to 30 C.

Preferably, the first portion of the first layer is removed via a dry process. Dry processes include plasma etching, for example Argon plasma etching, and other processes that do not involve wet chemistry.

A method for patterning a first layer is provided. The first layer is provided over a substrate, the first layer comprising a transparent conductive oxide. A strike layer comprising a metal is deposited on the first layer. A patterned second layer is applied on the strike layer via stamping, the second layer comprising the metal, such that the patterned second layer covers a first portion of the strike layer and the first layer, and does not cover a second portion of the strike layer and the first layer. The second portion of the strike layer is removed. The second portion of the first layer is also removed, via a subtractive process while the first portion of the first layer is protected from removal by the patterned second layer. After the second portion of the first layer is removed, the patterned second layer is removed, such that the first portion of the first layer remains.

FIGS. 1 through 6 illustrate an embodiment of a process used to pattern a first layer using a patterned second layer, applied via stamping, as a mask.

FIG. 1 shows a substrate 110. A first layer 120 is disposed over the substrate, and a strike layer 130 is disposed over the first layer. While it is preferred that there are no layers in between those illustrated, there may be such intermediate layers. Any suitable material may be used for the substrate. In a preferred embodiment, first layer 120 is made of a transparent semiconductor oxide material. These materials are preferred because they have a combination of properties that make them desirable for use as transparent electrodes. In addition, such materials may not transfer well via stamping, and the methods disclosed herein allow such materials to be patterned via stamping. However, the methods disclosed herein may also be used with other materials as the first layer. Strike layer 130 may be any material suitable for use as a strike layer. Preferred materials readily form bonds with patterned metal 140. Metals are preferred, and it is particularly preferable to use the same metal as patterned metal 140. While the use of a strike layer is generally preferred, it is optional in various embodiments described herein. A strike layer may be omitted if transfer of the patterned metal 140 from a stamp to a substrate may be achieved without a strike layer.

Figure 2:
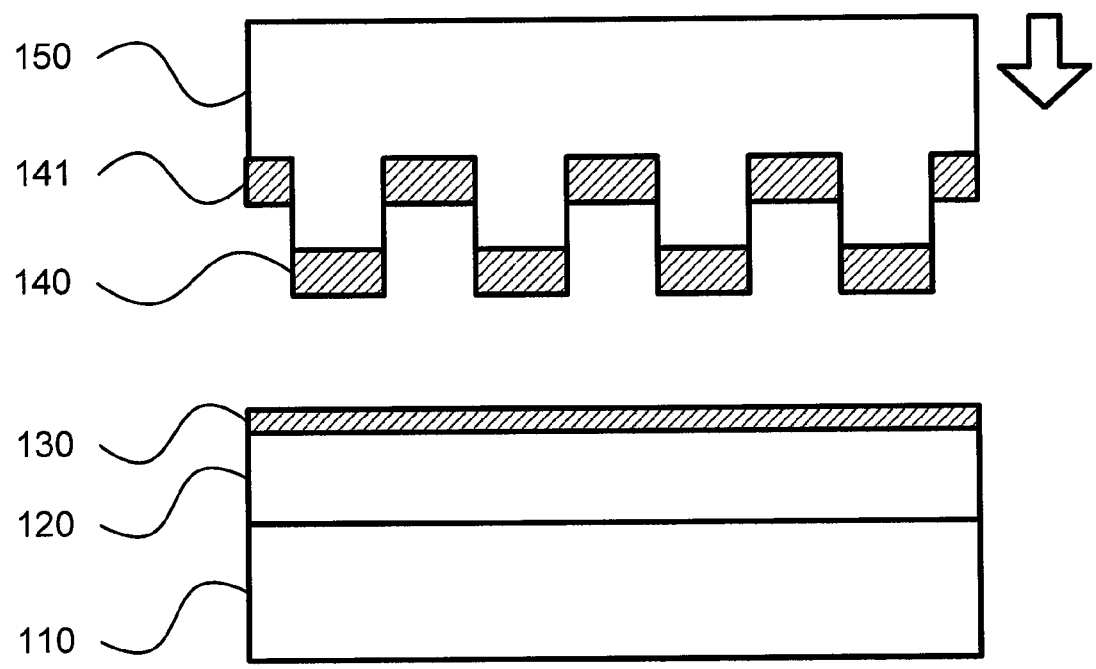
FIG. 2 shows the structure of FIG. 1, and also shows a patterned stamp having a patterned metal disposed thereon.

FIG. 2 shows substrate 110, first layer 120 and strike layer 130 of FIG. 1. FIG. 2 also shows patterned stamp 150. Patterned stamp 150 has a patterned metal 140 disposed on raised portions thereof. Residual metal 141 may be present on portions of patterned stamp 150 that are not raised. Patterned stamp 150 may be made of any suitable stamp material or combination of materials. Preferably, stamp 150 includes at least one elastomeric material, and may also include materials that are not elastomeric. PDMS is a preferred elastomeric material for use as a stamp due to its elastomeric properties and the ease with which it may be patterned using a silicon master.

Figure 3:
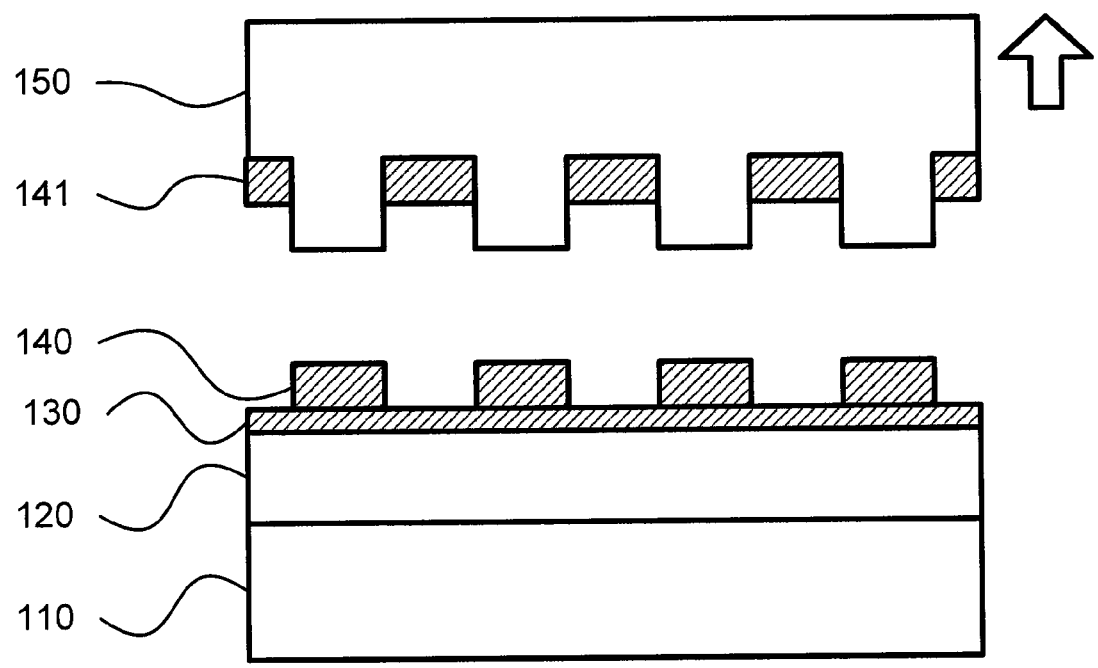
FIG. 3 shows the structure of FIG. 2, after the patterned metal has been transferred from the stamp to the planar substrate.

FIG. 3 shows substrate 110, first layer 120, strike layer 130, patterned metal 140, residual metal 141, and patterned stamp 150 of FIG. 2. In FIG. 3, relative to FIG. 2, patterned metal 140 has been transferred from patterned stamp 150 to substrate 110 via stamping.

Figure 4:
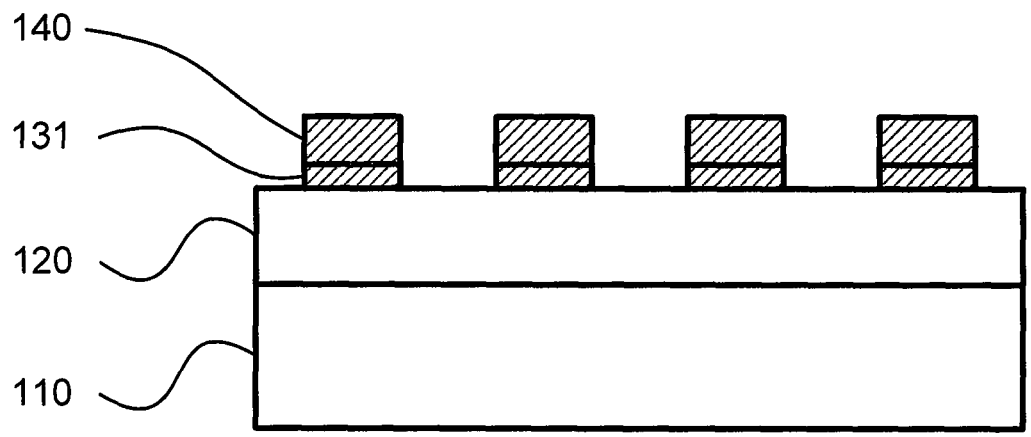
FIG. 4 shows the structure of FIG. 3, after portions of the strike layer have been removed.

FIG. 4 shows substrate 110, first layer 120, remaining portions 131 of strike layer 130, and patterned metal 140. Relative to FIG. 3, the configuration illustrated in FIG. 4 may be achieved by removing portions of strike layer 130 that are not protected by patterned metal 140, such that only portions 131 of the strike layer remain. For a gold strike layer and an indium tin oxide first layer, for example, such removal may be achieved by argon plasma etch, which may etch gold at a high rate relative to ITO. If similar materials are used for the strike layer and the patterned metal layer, such an etch may also attack the patterned metal layer, but the relative thicknesses are such that exposed portions of the strike layer may be removed without affecting the functionality of the patterned metal layer.

Figure 5:
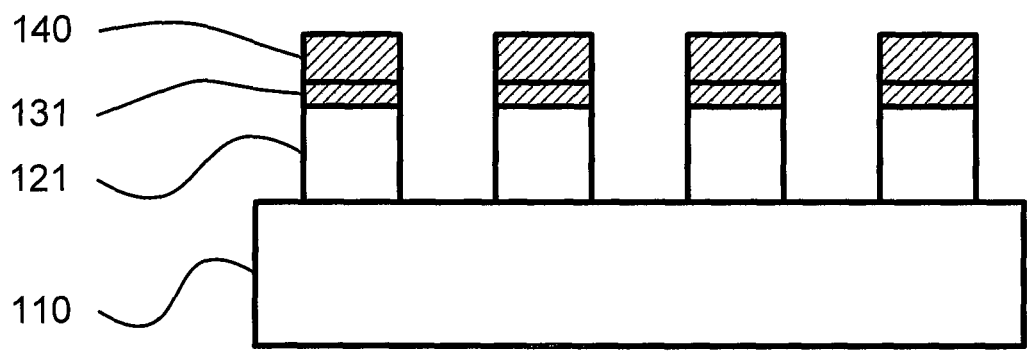
FIG. 5 shows the structure of FIG. 4, after portions of the electrode have been removed.

FIG. 5 shows substrate 110, a first portion 121 of first layer 120, remaining portions 131 of strike layer 130, and patterned metal 140. Relative to FIG. 4, the configuration illustrated in FIG. 5 may be achieved by removing a second portion of first layer 120, which is not covered by patterned metal 140, while leaving in place first portion 121, which is covered by patterned metal 140. Such removal may be achieved via an etching process that uses patterned metal 140 as a mask. For example, for a gold patterned metal layer 140 and an indium tin oxide first layer 120, exposure to oxalic acid is a preferred etching process. Other material combinations and etching processes may be used.

Figure 6:
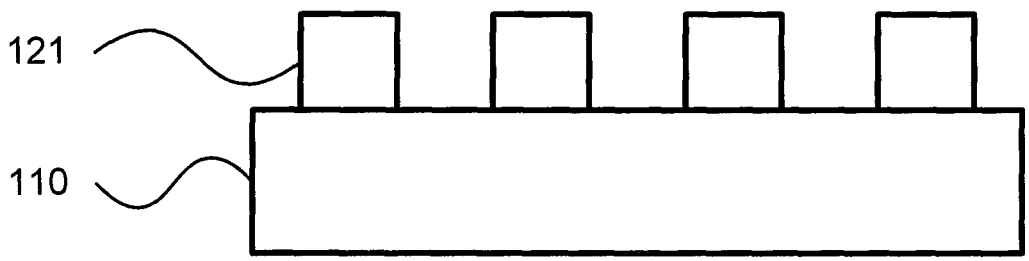
FIG. 6 shows the structure of FIG. 5, after the patterned metal and remaining portions of the strike layer have been removed, leaving a patterned electrode.

FIG. 6 shows substrate 110 and a first portion 121 of first layer 120. Relative to FIG. 5, the configuration illustrated in FIG. 6 may be achieved by removing patterned metal 140 and remaining portions 131 of the strike layer. For a gold patterned metal, a gold strike layer, and an indium tin oxide first layer, an etchant that preferentially etches gold over ITO may be used. Other material combinations and etchants may be used.

Figure 7:
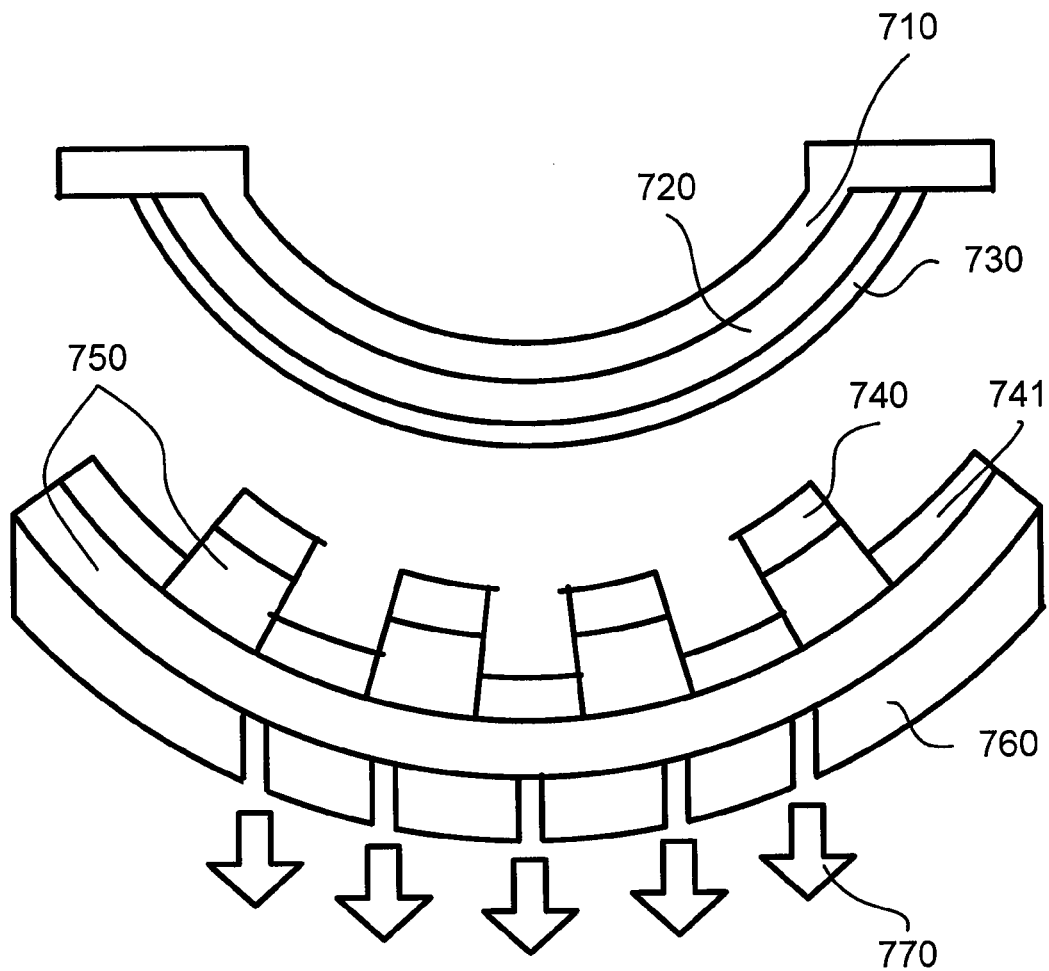
FIG. 7 shows a curved substrate having an electrode and a strike layer disposed thereon, and also shows a patterned stamp having a patterned metal disposed thereon.
Figure 8:
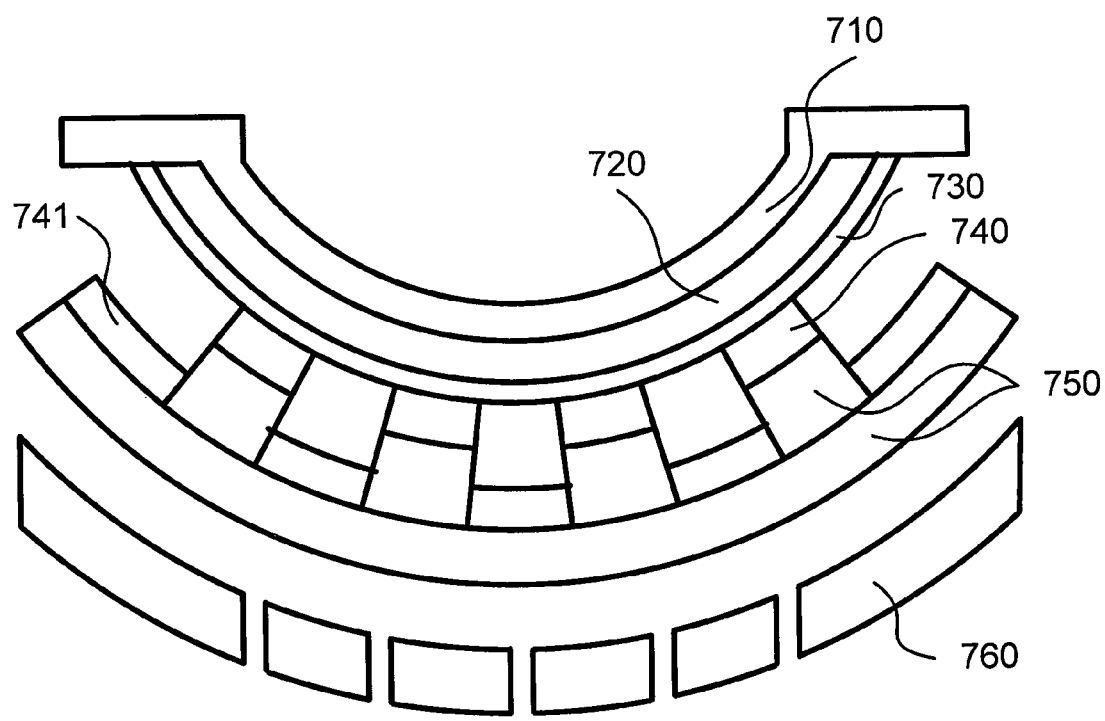
FIG. 8 shows the structure of FIG. 7, while the patterned metal is being transferred via stamping from the patterned stamp to the substrate.
Figure 9:
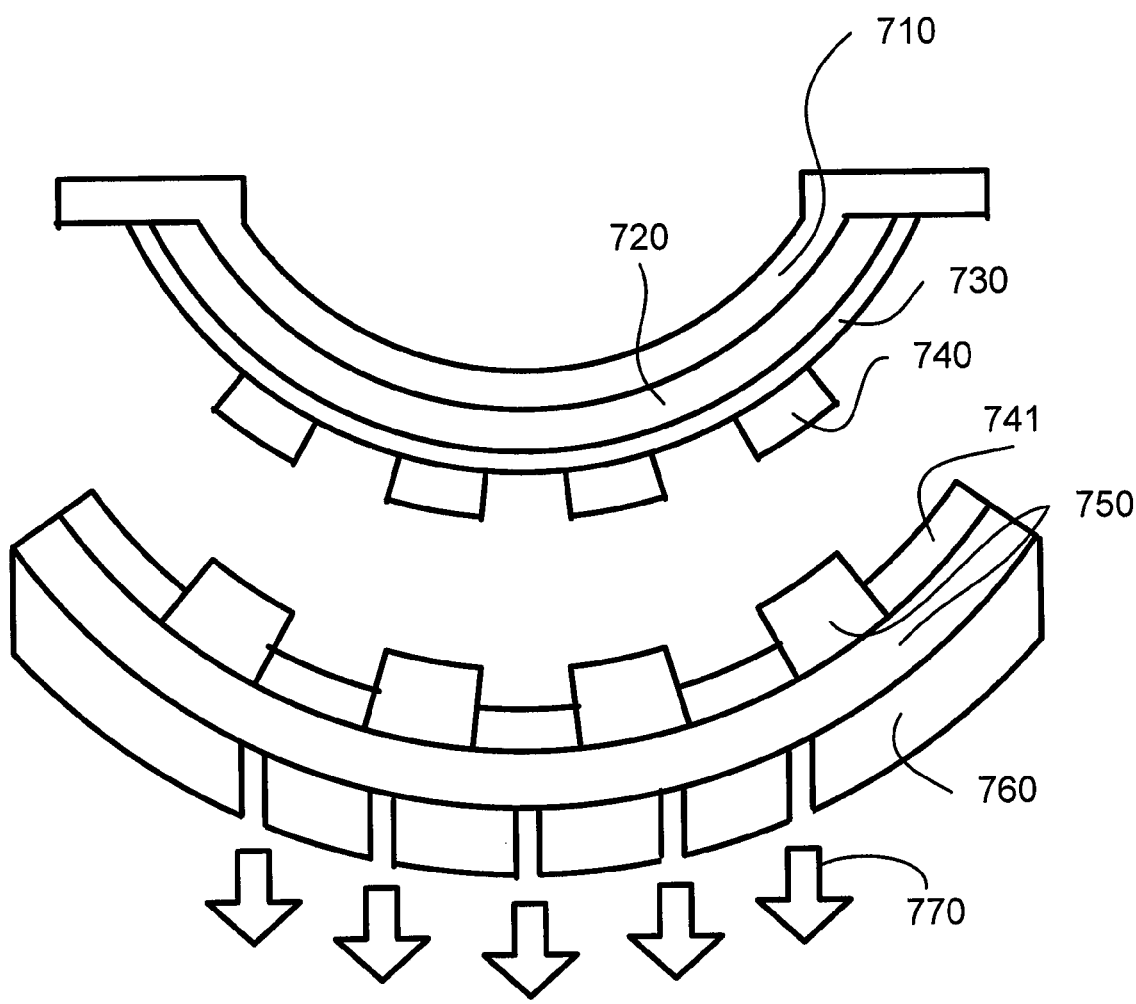
FIG. 9 shows the structure of FIG. 8 after the patterned metal is transferred via stamping from the patterned stamp to the substrate.

FIGS. 7 through 9 illustrate the application of a patterned metal layer over a first layer on a curved substrate, analogous to FIGS. 1 through 3.

FIG. 7 shows substrate 710, first layer 720 and strike layer 730, where substrate 710 is curved, preferably with 2 dimensional curvature, for example spherical curvature. FIG. 7 also shows patterned stamp 750. Patterned stamp 750 has a patterned metal 740 disposed on raised portions thereof. Residual metal 741 may be present on portions of patterned stamp 750 that are not raised. Patterned stamp 750 may be made of any suitable stamp material or combination of materials. The configuration illustrated is similar to that of FIG. 2, except for the curvature. Similar materials may be used. In addition, FIG. 7 shows a vacuum device 760 which holds patterned stamp 750 in place. Arrows 770 illustrate a vacuum holding patterned stamp 750 in place, which, when released, results in the configuration illustrated in FIG. 8.

FIG. 8 shows substrate 710, first layer 720, strike layer 730, patterned stamp 750 with patterned metal 740 disposed on raised portions thereof, and residual metal 741 present on portions of patterned stamp 750 that are not raised, and vacuum device 760. Relative to FIG. 7, vacuum has been released, allowing the elasticity of patterned stamp 750 to press patterned metal 740 against strike layer 730. The use of a vacuum device with a curved surface is exemplary, and any suitable method of pressing a stamp against a substrate may be used.

FIG. 9 shows substrate 710, first layer 720, strike layer 730, patterned stamp 750, and residual metal 741 present on portions of patterned stamp 750 that are not raised, and vacuum device 760. Relative to FIG. 8, vacuum has been reapplied to lift patterned stamp 750 away from substrate 710, and patterned metal 740 has been transferred from stamp 750 to substrate 110.

Figure 10:
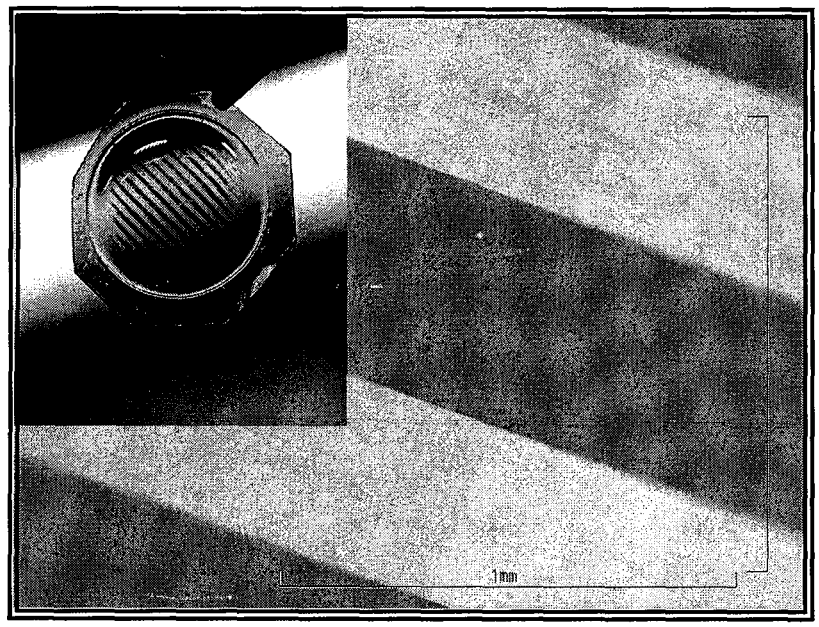
FIG. 10 shows a photograph of a 10 by 10 array of photodetectors on a curved substrate, having an electrode patterned by the method described in FIGS. 7 through 9.
Figure 11:
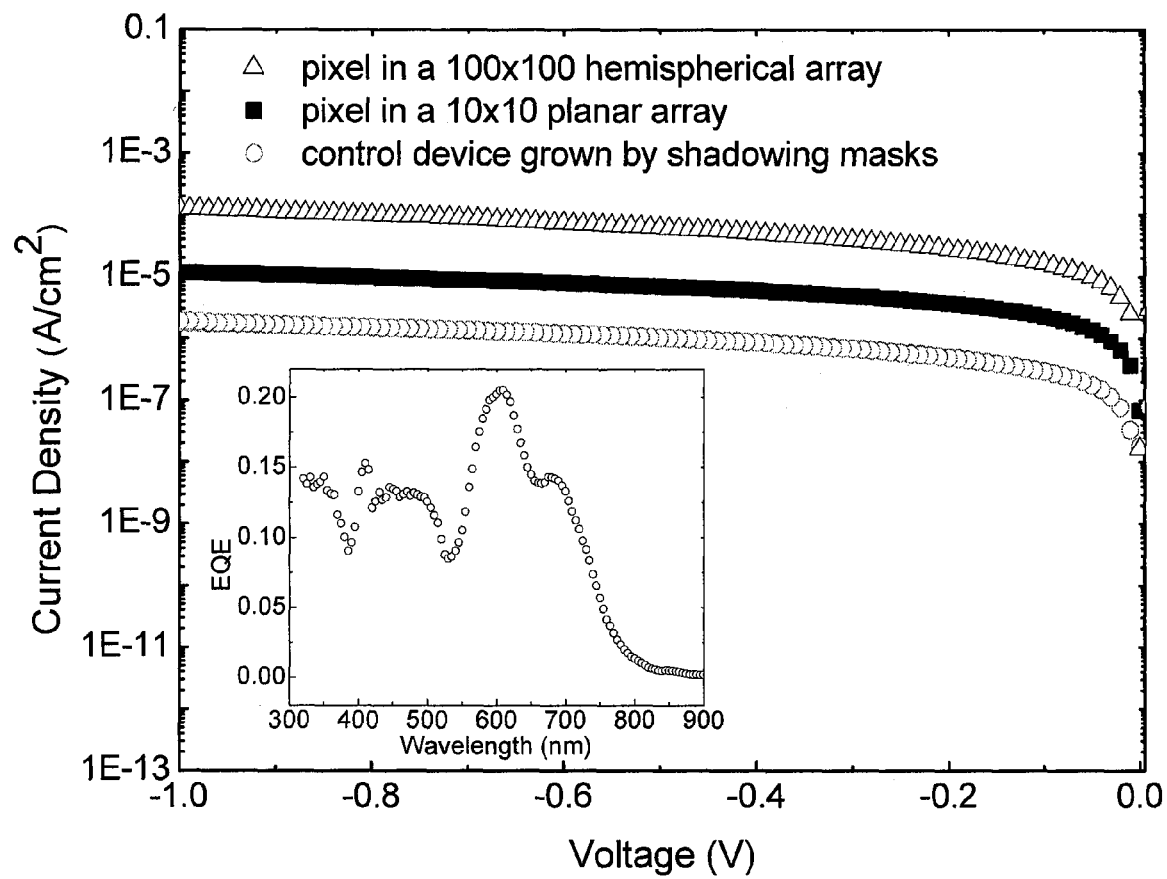
FIG. 11 shows a plot of current density v. voltage for several devices, including devices fabricated using a mask transferred via stamping.

The configuration illustrated in FIG. 9 is analogous to that illustrated in FIG. 3, except that the substrate is curved. First layer 720 may be patterned, and strike layer 730 and patterned metal 740 removed, using steps similar to those illustrated and described for FIGS. 4 to 6. FIG. 10 shows a photograph of a 10 by 10 pixel array of photodetectors, i.e. 100 pixels, having indium tin oxide electrodes fabricated as described for first layer 720. FIG. 11 shows the results of measurements of those devices.

Transparent conductors represent an important material application where multifunctional control of optical and electrical properties is required. Examples of these materials include semiconducting oxides of tin, indium, zinc, and cadmium, and metals such as silver, gold, and titanium nitride. Indium Tin Oxide ($In_{2x}Sn_xO_3$ or ITO) presently represents one of the best combinations of transparency and conductivity and has been demonstrated as an integral component in flat panel displays, solar cells, and smart windows. A method of patterning ITO on top of a nonflat (curved) substrate is provided. Utilization of this method can be extended to a variety of electronic applications and novel device architectures. The method involves the use of a patterned mask transferred via stamping. The method is particularly useful for patterning transparent conductive oxides and other brittle materials, particularly on surfaces having 2-dimensional curvature.

Patterning indium tin oxide (ITO) using conventional photolithography followed by wet or dry etching has been well described. Breen, T. L. et al., Langmuir, 18(1):194-197 (2002); Mohri, M. et al., Japanese Journal of Applied Physics Part 2-Letters, 29(10):L1932-L1935 (1990); Scholten, M. and J. E. A. M. Vandenmeerakker, Journal of the Electrochemical Society, 140(2):471-475 (1993); Tsai, T. R. and Y. F. Wu, Microelectronic Engineering, 83(3):536-541 (2006). Although these methods are well suited for flat substrates, they may not be well suited to patterning of ITO on a nonplanar surface. A method of using a mask transferred via stamping for patterning is provided. A specific example used to illustrate the method involves a mask or "metal resist" of Au that is transferred by a poly(dimethylsiloxane) (PDMS) stamp onto a hemispherical plastic substrate. The transferred metal layer preserves the pattern by protecting the ITO underneath and allowing the exposed layers to dissolve in an etching solution.

Techniques useful for applying a patterned layer via stamping to a non-planar surface, including surfaces having two-dimensional curvature, and non-developable surfaces, are disclosed in U.S. Patent Publication 2008-0202673. Application of a patterned layer to a non-planar surface via stamping, is disclosed in U.S. Patent Publication 2008-0202673, and is described below with respect to FIGS. 12 to 19.

Figure 12A:
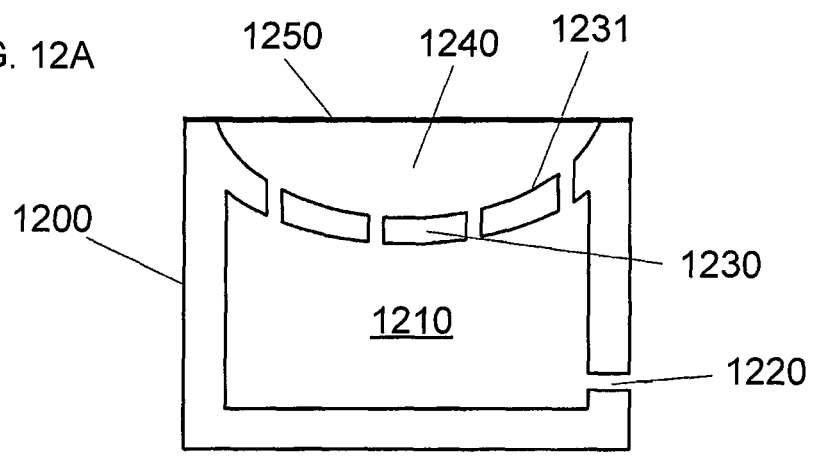
FIG. 12A shows an elastomeric stamp on a vacuum mold.

An exemplary vacuum mold 1200 and elastomeric stamp 1250 are shown in FIG. 12A. It will be understood that the drawings referred to herein are not drawn to scale, and some features may be exaggerated or omitted for clarity. Although a rectangular mold is shown for illustration purposes, the vacuum mold may be any shape. For example, a cylindrical vacuum mold may have an interior connected to a vacuum source. An elastomeric stamp may be placed over an opening on the side of the cylindrical mold, i.e., the surface that is not a circular end surface. When a vacuum is applied by the vacuum source, the elastomeric stamp may deform into the interior of the cylindrical vacuum mold. Other shapes and configurations of vacuum molds may be used.

A vacuum mold and elastomeric stamp as described herein may be particularly useful for depositing material on a non-planar substrate having two-dimensional curvature, such as an ellipsoidal substrate or other non-planar configuration where a roll-to-roll or similar process cannot be used.

The vacuum mold 1200 has an interior cavity 1210 connected to a vacuum source, such as by a second opening 1220 in the vacuum mold. An elastomeric stamp 1250 may be placed over the main opening in the vacuum mold 1240 and hermetically sealed to the circumference of the opening. When a vacuum is applied to the vacuum mold, the elastomeric stamp may be deformed into the vacuum mold.

Figure 12B:
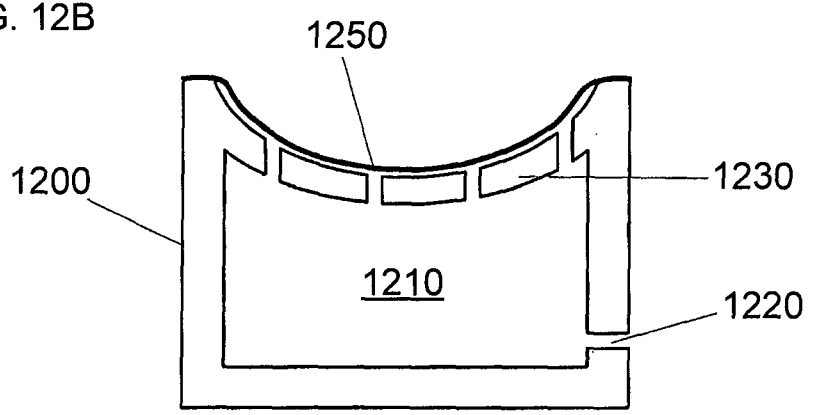
FIG. 12B shows a deformed elastomeric stamp on a vacuum old.
Figure 12C:
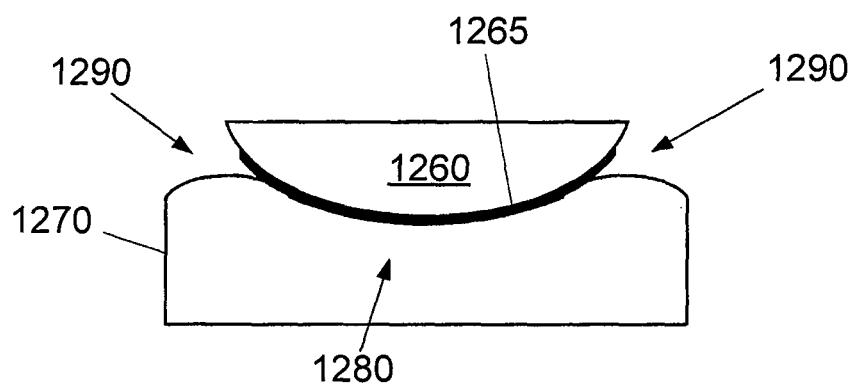
FIG. 12C shows an elastomeric stamp disposed between a substrate and a curved surface.

The vacuum mold may have a permeable or semi-permeable surface 1230. Such a surface may be desirable to prevent the elastomeric stamp 1250 from deforming into the vacuum mold beyond a desired amount. It may also be used to deform the stamp into a specific desired shape, such as when the surface 1230 has the same general shape as the substrate on which material is to be deposited. Preferably, it has a surface that is concave in the direction away from the vacuum chamber, such as outer surface 1231 shown in FIG. 12A. FIG. 12B shows an elastomeric stamp 1250 partially deformed by a vacuum applied to the interior cavity 1210 of the vacuum mold 1200. As discussed in further detail below, the stamp 1250 may be deformed until it comes into contact with the surface 1230, or it may be deformed to a configuration between the planar configuration shown in FIG. 12A and a configuration where the stamp is in contact with the surface 1230.

It may be preferred for the surface 1230 to have generally the same shape as a substrate on which material is to be deposited by the elastomeric stamp. For example, if material is to be transferred from the stamp to the substrate due to pressure exerted on the stamp by the substrate, the surface 1230 may provide support for the stamp during material transfer. As used herein, when a thin elastomeric sheet is placed between a surface 1230 and a substrate surface, and pressure of a degree normally used to transfer material from an elastomeric stamp to a substrate is applied to one or both surfaces, the region of each surface considered to be "generally the same shape" is the region in conformal contact with the elastomeric sheet. For example, referring to FIG. 12C, a substrate 1260 is placed over a vacuum mold 1270 having an upper surface with sections of varying curvature. When an elastomeric sheet 1265 is placed between the substrate 1260 and the mold 1270 and pressure is applied, portions of the substrate surface and the mold surface are in conformal contact with the elastomeric sheet. In the central region 1280, each surface is in conformal contact with the sheet; this region of the surfaces therefore may be described as having the same general shape or being generally the same shape. The outer regions 1290 are not in conformal contact with the sheet, and therefore these regions are not generally the same shape.

The degree to which two surfaces are generally the same shape may be quantified based on the degree to which an elastomeric stamp placed between the surface deforms to be in conformal contact with both surfaces.

The elastomeric stamp may be used to deposit material on a non-planar substrate. Any non-planar substrate may be used, with substrates having at least one surface with two-dimensional curvature being preferred. The material to be deposited is preferably a metal or a metallic compound, though other materials may be used. The material may be deposited on the stamp while the stamp is in a planar configuration or after the stamp has been deformed to a shape generally the same as the shape of the non-planar substrate. The elastomeric stamp may be deformed with a vacuum mold; when the vacuum is released or decreased the stamp may become less deformed, i.e., more planar. Pressure may be applied to transfer material from the coated stamp to the substrate. Pressure may be applied due to the elasticity of the stamp, by applying a force to the substrate and/or the stamp, or both.

Figure 13:
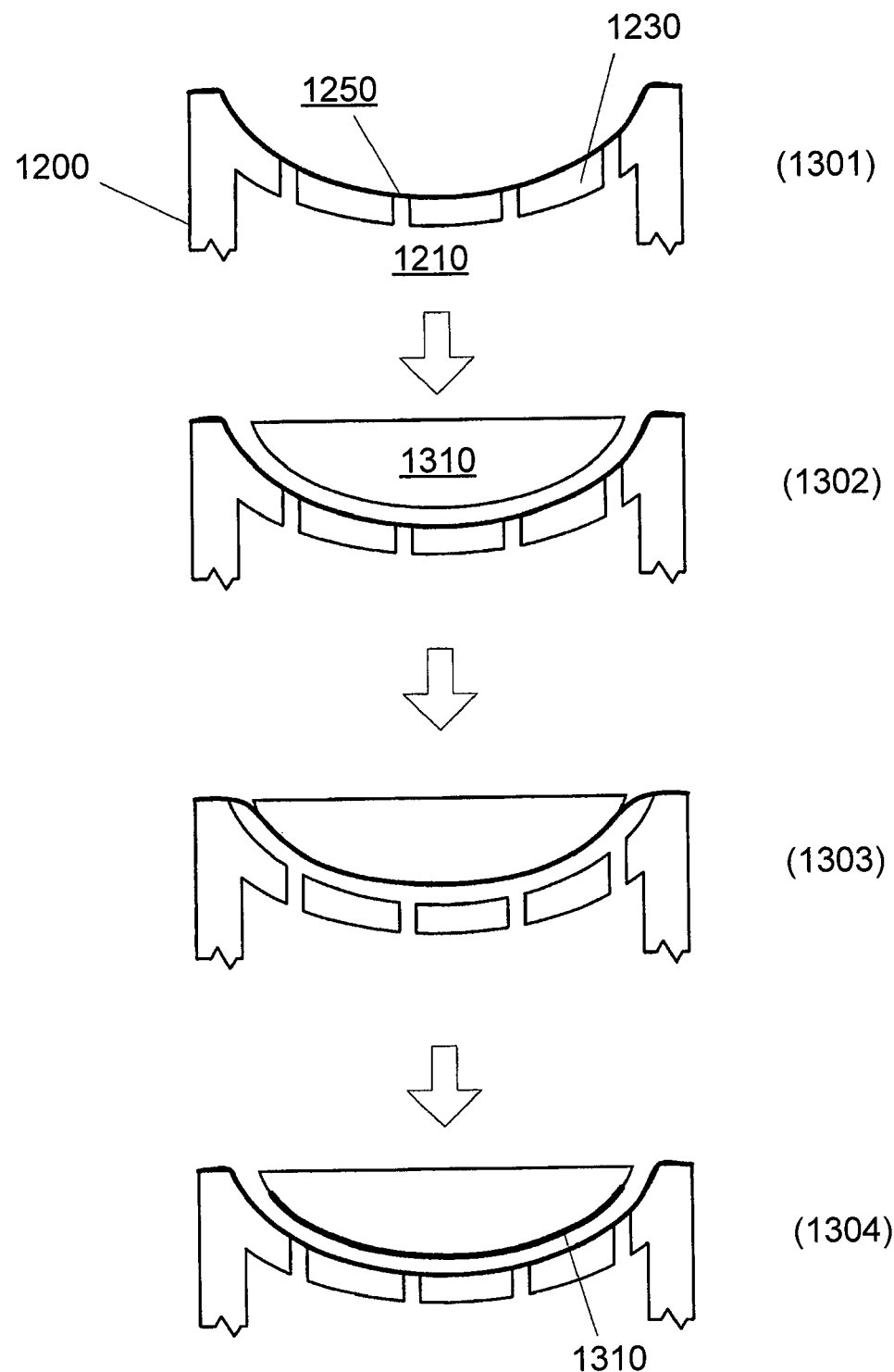
FIG. 13 shows a vacuum mold and an elastomeric stamp used to deposit a layer of material on a substrate.

FIG. 13 shows a method of depositing material on a substrate 1300 using a vacuum mold 1200 and an elastomeric stamp 1250. For clarity, only a portion of the vacuum mold in the region of the stamp is shown. Steps 1301-1304 are indicated by reference numerals shown in parentheses. As previously described, an elastomeric stamp 1250 may be placed over an opening in a vacuum mold 1200 and hermetically sealed to the edge of the opening. When a vacuum is applied to an internal cavity 1210 of the vacuum mold, the elastomeric stamp may be deformed into the mold (1301). The stamp 1250 may be coated with the material to be deposited before it is deformed, i.e., while in a planar configuration, or it may be coated after being deformed into the vacuum mold.

A non-planar substrate 1300 on which material to be deposited is placed above the coated, deformed stamp (1302). A substrate having one-dimensional curvature, such as the curved surface of a cylinder, may be used. Preferably, the substrate has two-dimensional curvature. Typically, the substrate has at least one surface that is non-developable. That is, the surface is a topological shape that cannot be flattened onto a plane without distortion such as stretching, compressing, or tearing. The entire substrate may be non-developable, such as where a substrate is created by deforming a thin sheet to have a dome or semi-spherical shape. Pressure may be applied between the substrate 1300 and the coated stamp 1250 to transfer material from the stamp surface to the substrate. For example, as shown in FIG. 13 the vacuum may be released or decreased. Due to the elastic properties of the stamp, the stamp may then relax until it is in conformal contact with the substrate (1303). Other procedures may be used to exert force between the substrate and the stamp. After pressure has been applied between the substrate and the stamp, the stamp may be removed from the substrate. A layer 1310 of material is deposited on the substrate surface. The material may be deposited over the entire surface of the substrate such as the curved surface shown in FIG. 13, or it may be deposited on only a portion of the substrate surface.

Figure 14:
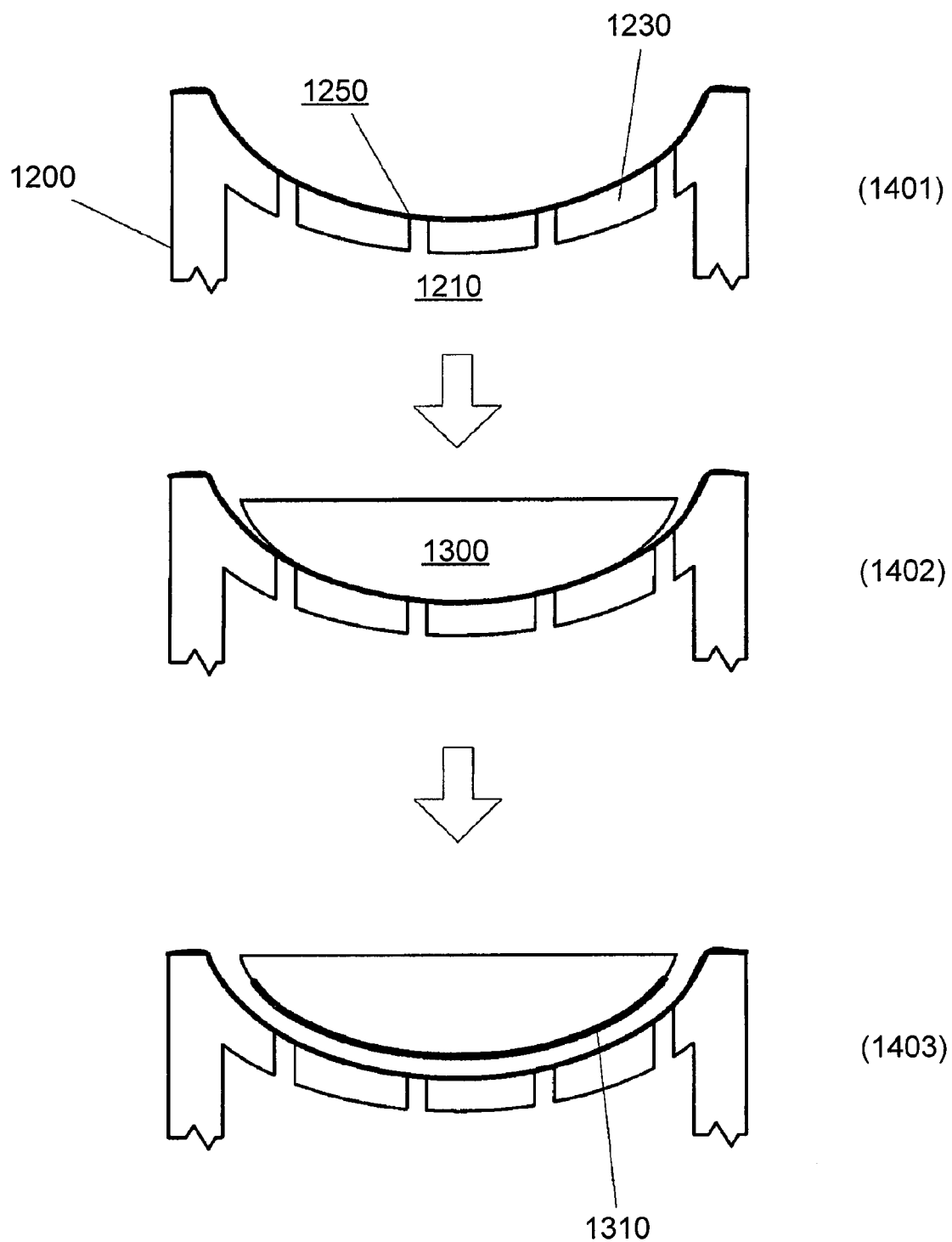
FIG. 14 shows a vacuum mold and an elastomeric stamp used to deposit a layer of material on a substrate.

Material may also be transferred from the stamp to the substrate by directly applying pressure between the stamp and the substrate. FIG. 14 shows a method of depositing a layer of material on a non-planar substrate using an elastomeric stamp. As previously described, the stamp may be deformed and coated with the material to be deposited (1401). The stamp 1250 may be coated with the material to be deposited before it is deformed, i.e., while in a planar configuration, or it may be coated after being deformed into the vacuum mold. The stamp may be deformed into the vacuum mold 1200 until it contacts the surface 1230. Preferably, the stamp may contour the surface 1230. While the stamp is deformed into the vacuum mold, a substrate 1300 may be placed on the stamp (1402) and pressure applied between the stamp and substrate to transfer material from the stamp to the substrate. For example, a force may be applied to the substrate. The substrate then may be removed from the stamp (1403), with the deposited layer 1310.

Figure 15:
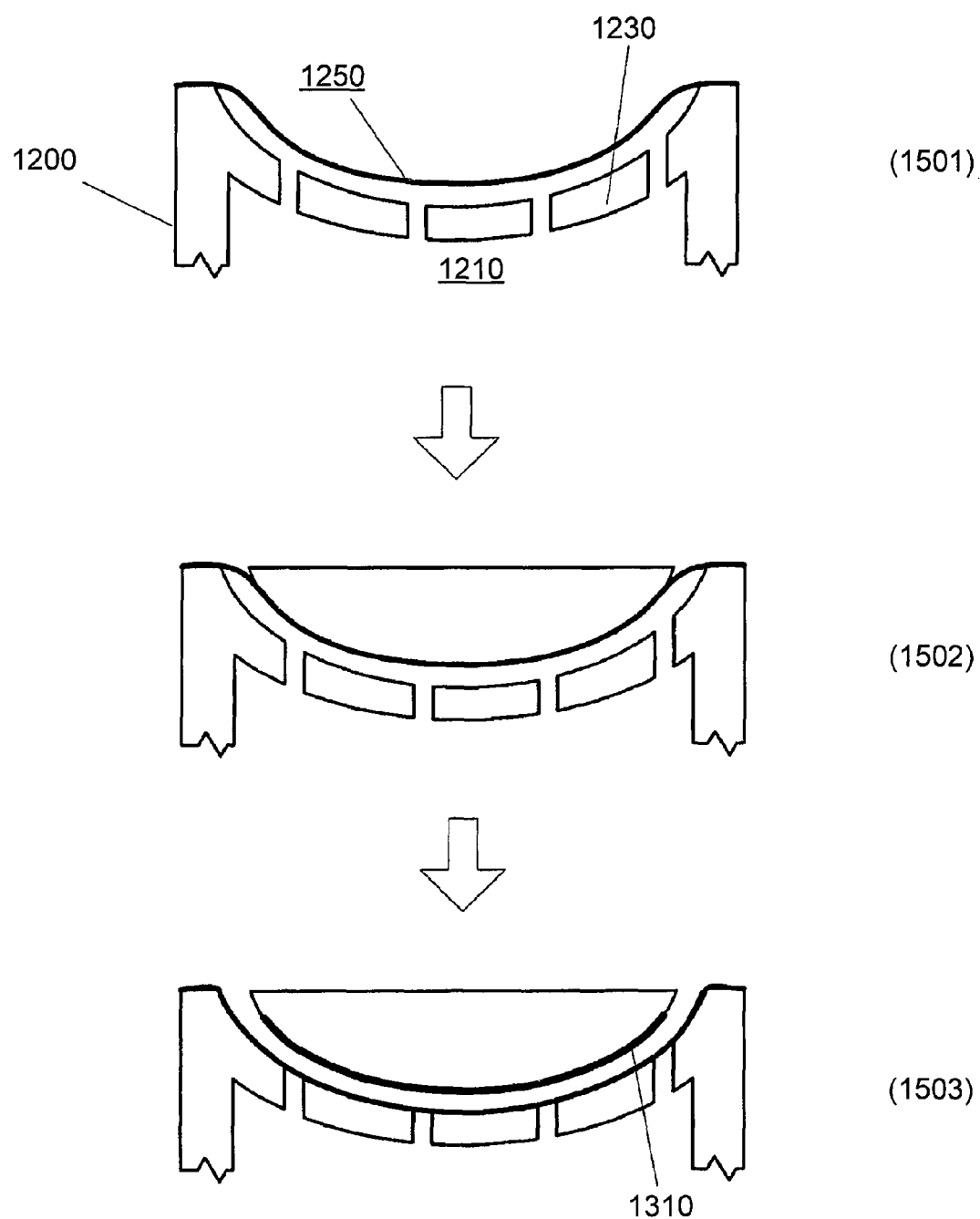
FIG. 15 shows a vacuum mold and an elastomeric stamp used to deposit a layer of material on a substrate.

The vacuum mold may also be used to remove the stamp from the substrate after material is transferred. For example, FIG. 15 shows a process similar to that shown in FIG. 14. In FIG. 15, an elastomeric stamp 1250 is fixed in a deformed configuration (1501). For example, a planar PDMS stamp may be placed over a vacuum mold, and a vacuum applied to deform the stamp to a desired configuration. Heat may then be applied to fix the stamp in the desired configuration. For example, if a PDMS stamp is heated to about 135° C., it will retain the shape to which it is deformed when the heat is applied. The stamp may be further deformed after being fixed in a deformed configuration, but once the additional deforming force is removed, the stamp will return to the fixed configuration. The stamp may be fixed into a new configuration by further deforming and heating the stamp. Other materials and processes may be used to form a stamp of a desired configuration, such as elastomeric materials that may be fixed by curing with radiation, such as ultraviolet light, heat, chemical reaction, or other processes. The stamp may be coated with a material to be deposited after it has been fixed in a deformed configuration, or it may be coated while in a planar configuration, before it has been fixed in a deformed configuration. A substrate 1300 may be placed against the coated, pre-deformed stamp and pressure applied between the stamp and the substrate to transfer material from the stamp to the substrate (1502). The coated substrate may then be removed from the stamp (1503).

Figure 16:
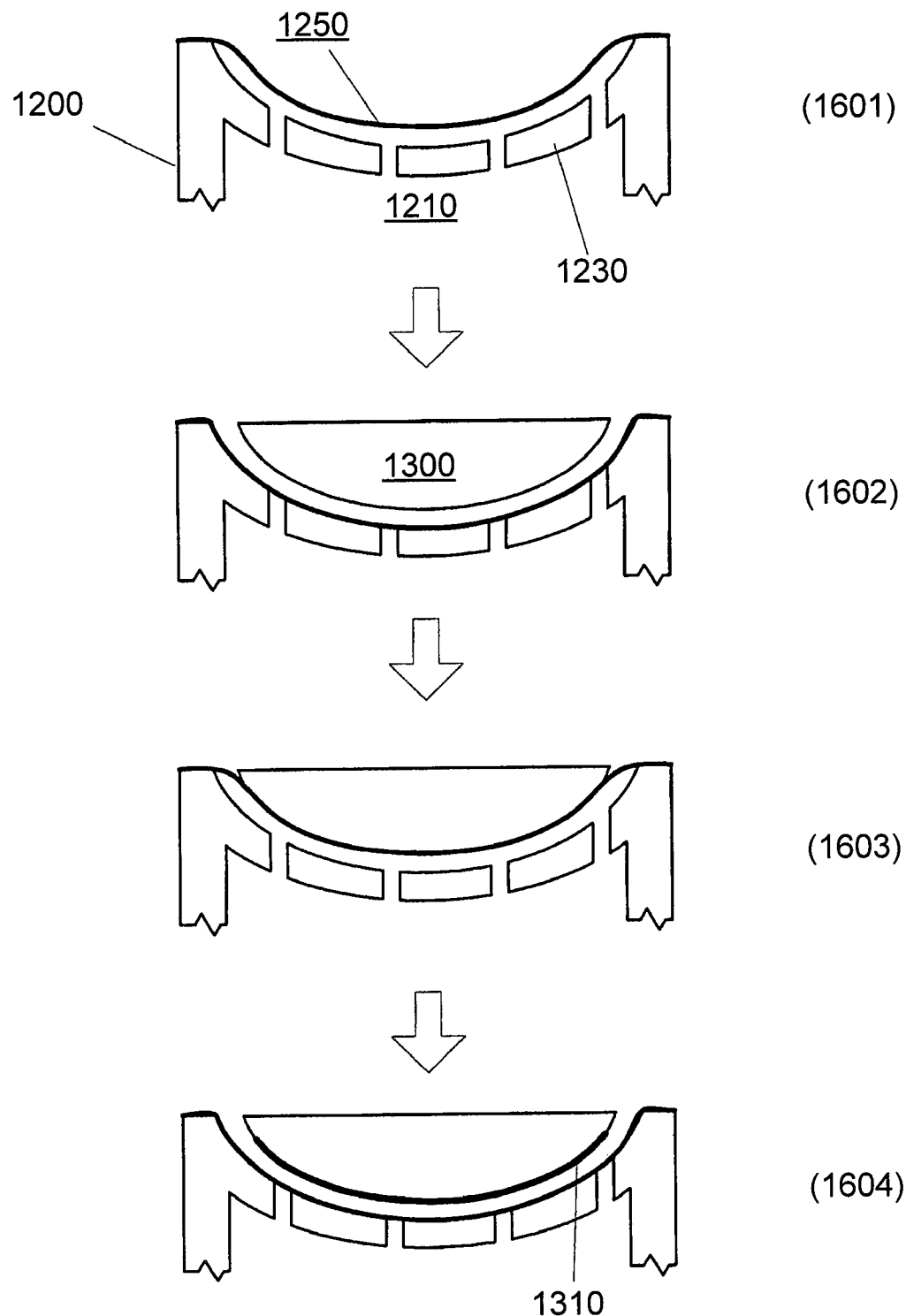
FIG. 16 shows a vacuum mold and an elastomeric stamp used to deposit a layer of material on a substrate.

As previously described with respect to FIG. 13, the elasticity of an elastomeric stamp can also be utilized to exert pressure between the stamp and a non-planar substrate. Referring to FIG. 16, a pre-deformed, coated stamp may be attached to a vacuum mold as previously described with respect to FIG. 15 (1601). The pre-deformed stamp may be further deformed into the vacuum mold by application of a vacuum to the vacuum mold and a substrate may be placed over the stamp (1602). When the vacuum is reduced or removed, the elasticity of the stamp may cause it to return to the fixed, deformed configuration and come into conformal contact with the non-planar substrate (1603). The elasticity of the stamp may further cause the stamp to exert pressure against the substrate, transferring material from the stamp to the substrate. After material has been transferred, a vacuum may be applied to the mold to further deform the stamp and remove the stamp from the substrate (1604).

The various method steps shown in FIGS. 13-16 may be performed in an order different than that indicated by the reference numerals. For example, the elastomeric stamp may be coated with the material to be deposited before being placed on and/or hermetically sealed to the vacuum mold. It also may be coated before being deformed and/or fixed in a deformed configuration. Other variations from the illustrated order may be used without affecting the results described herein.

Figure 17:
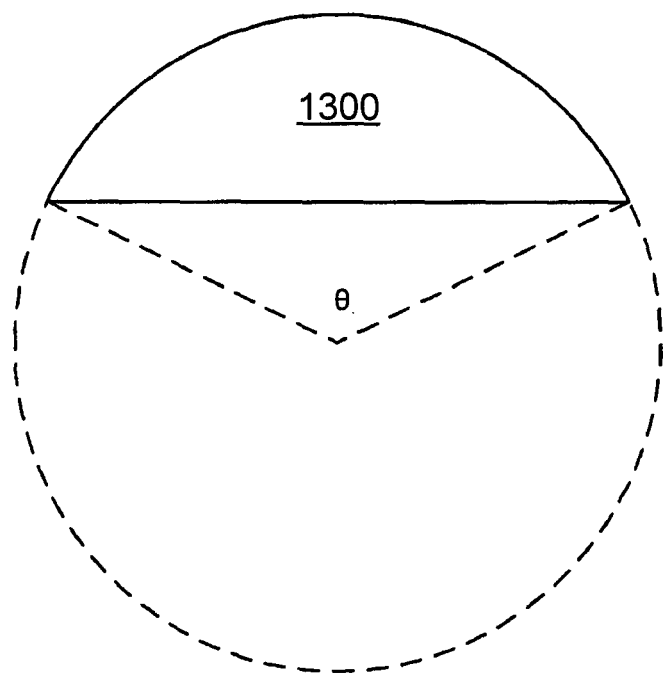
FIG. 17 shows a circular non-planar substrate.
Figure 18A:
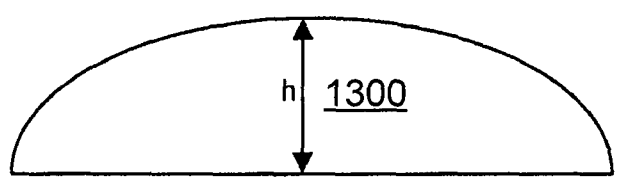
FIG. 18A shows a side cross section of an ellipsoidal substrate.
Figure 18B:
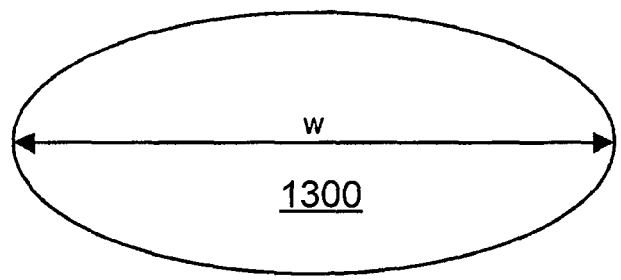
FIG. 18B shows a bottom view of the ellipsoidal substrate shown in FIG. 18A.

Various substrate shapes may be used. Substrates having a surface that is ellipsoidal or semi-spherical may be preferred. An ellipsoidal surface is one formed by rotation of an elliptical curve around an axis. A semi-spherical surface is one having a cross-section that is an arc. A semi-spherical substrate may be characterized by the angle subtended by a cross-section of the substrate. For example, FIG. 17 shows a substrate which subtends an angle of θ. It may be preferred for a circular substrate to subtend an angle of 60-120°. Other shapes may be used. Typically, non-planar substrates will have at least one continuously curved surface. A non-planar substrate may be further characterized by the major axis measured across a flat surface of the substrate, and the maximum height of the substrate measured along a line perpendicular to a flat surface of the substrate to a point on the curved surface of the substrate. FIG. 18A shows a cross-section of a non-planar substrate having a flat surface and a curved surface, with a maximum height of h. FIG. 18B shows a bottom view of the same substrate as in FIG. 18A, with the major axis identified. For an ellipsoidal substrate having a planar base, the major axis is the same as the major axis of the ellipse formed by the base of the substrate. If a non-planar substrate does not have a planar surface, the major axis may be identified relative to the shape defined by the substrate when viewed from above or below. For example, a thin, dome-shaped or semi-spherical substrate having a convex outer surface and a concave inner surface defines an ellipse or a circle when viewed from below. For other shapes of substrates, the major axis may be identified as the longest distance measured across a flat surface of the substrate or across the shape defined by the substrate when viewed from below. In general it is preferred for the ratio of the maximum height of the non-planar substrate to the major axis of the non-planar substrate to be at least 0.1.

Various processes may be used to effectuate transfer of material from the elastomeric stamp to the substrate while the stamp and the substrate are in contact, such as in configurations (1303), (1402), (1502), or (1603). A preferred method of transferring material is the use of cold welding. As used herein, cold welding refers to bonding of like materials at room temperature due to an application of pressure, such as bonding between two metals. Additional information regarding cold welding is provided in U.S. application Ser. No. 10/387,925 filed Mar. 13, 2003 to Kim et al., the disclosure of which is incorporated by reference in its entirety. Properties of the material being deposited may also be used. For example, the substrate and the stamp may be brought into contact for a time sufficient to allow a self-assembled monolayer of the material to form on the substrate. A chemical reaction may also occur or be induced to assist with material transfer or strengthen the bond between the substrate and the deposited material. Additional curing or bonding agents may be used to improve or affect the transfer of material. For example, heat, ultraviolet light, or an oxidizing agent may be applied to the stamp, the substrate, or both. Such agents may be applied in the configurations previously referenced, or they may be applied before the stamp and the substrate are in contact. It may be preferred to treat the stamp, the substrate, or both with a plasma oxidation process prior to placing the substrate on the stamp; such treatment has been found to improve adhesion of the deposited material to the substrate.

Figure 19A:
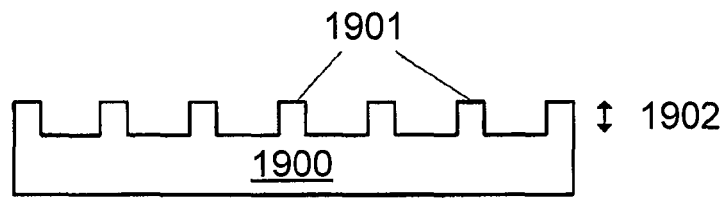
FIG. 19A shows a patterned elastomeric stamp.
Figure 19B:
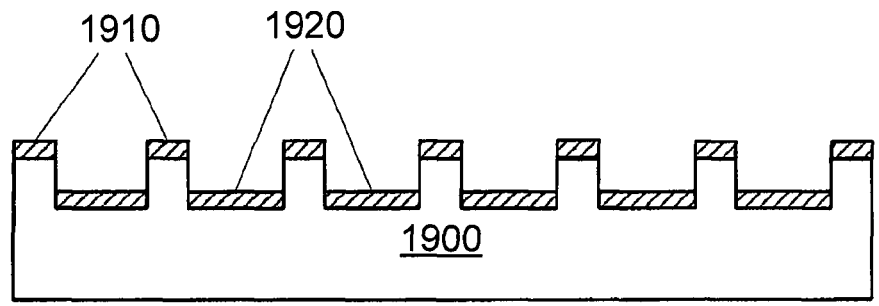
FIG. 19B shows a patterned elastomeric stamp coated with a material to be deposited.
Figure 19C:
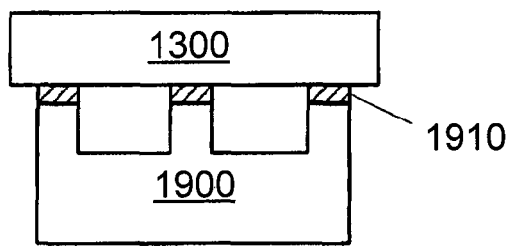
FIG. 19C shows a coated, patterned elastomeric stamp in contact with a substrate.
Figure 19D:
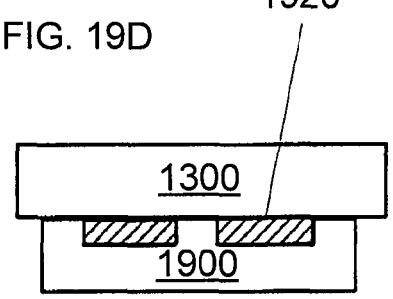
FIG. 19D shows a coated, patterned elastomeric stamp in contact with a substrate.

It may be preferred for the stamp to be patterned, such as when an electrode is to be deposited. The pattern preferably has raised features extending 5 nm to 3 μm from the base of the stamp. FIG. 19A shows an exemplary patterned elastomeric stamp 1900 with raised features 1901 extending a distance 1902 from the base of the stamp. The raised features 1901 may all have the same dimensions, or various patterns may be used. As a specific example, when the stamp is used to deposit an electrode for use in an optoelectronic device, the raised features may be arranged in a pattern useful for such an electrode, such as a grid, parallel strips, or other pattern. FIG. 19B shows a patterned elastomeric stamp coated with a material to be deposited on a substrate. The stamp may be coated on the outer surface of the pattern features 1910, in the spaces between the pattern features 1920, or both, using deposition techniques known in the art. After the pattern is coated, material may be transferred to a substrate 1300 by applying pressure between the stamp and the substrate as previously described. FIG. 19C shows a patterned stamp transferring material to a substrate. When the regions between the pattern features are coated, material may be transferred by applying pressure sufficient to compact the stamp and cause these regions to come into contact with the substrate, as illustrated in FIG. 19D. Although FIGS. 19C and 19D illustrate a planar substrate for clarity, it will be understood that a non-planar substrate as previously described may be used.

The elastomeric stamp may be made of any suitable material, with PDMS being preferred. The stamp may be a hybrid stamp, i.e., have multiple layers of different elastomeric materials of varying elasticity or hardness. For example, a stamp may have a hard, less elastic center portion and a soft, more elastic outer portion. The stamp may have a gradient elasticity and/or hardness. Such hybrid stamps may be useful for depositing on substrates having high curvature, since it may be desirable for the inner portions of the stamp to deform more or less easily than the outer portions. The specific configuration of a hybrid stamp may be matched to the degree of deformation each region of the stamp is expected to undergo when depositing material on a specific substrate.

The substrate can be any suitable material, with PETg being preferred. A substrate may contain multiple layers, such as a non-planar PETg dome coated with a uniform layer of metal. The substrate may include additional pre-deposited layers, such as strike layers. It may also be treated, such as with a chemical precursor or radiation, to enhance bonding between the substrate and the material deposited by the stamp. A vacuum mold such as described with respect to FIG. 12A can be used to create a non-planar substrate. Such a process may be desirable to construct a substrate and a deformed elastomeric stamp having the same shape. For example, a PETg substrate may be placed into a vacuum mold having a concave surface, such as surface 1230 in FIG. 12, and heated until the substrate contours the surface, and then cooled to freeze the shape. The substrate may then be removed and an elastomeric stamp placed in the mold and deformed as previously described. The substrate may then be placed over a coated, deformed stamp to transfer material from the coated stamp to the substrate.

In conclusion, we have demonstrated a stamping method to additively transfer metal masks and then pattern ITO electrodes. The technique, compared with traditional photolithography, extends the adaptability to nonplanar surfaces thus becomes a potential way to fabricate high performance, high resolution organic electronic devices on three dimensional surfaces. As an example, photodetector focal plane arrays on planar and hemispherical surfaces are fabricated using this technique. Another interesting application may be fabrication of organic light emitting diodes (OLED) on nonplanar surfaces.

Devices fabricated as described herein may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

EXAMPLES

Example 1

Example 1 provides an example of a mask, specifically a gold mask, transferred via stamping and used to pattern an underlying layer, specifically an ITO layer, on a substrate having 2-dimensional curvature.
Step 1
A glycol-modified polyethylene terephthalate (PETg) substrate was provided. PETg can be formed into a variety of shapes and sizes. In this example the PETg is formed into a 1 cm radius hemispherical dome with 120° curvature using heat and a vacuum device, similar to vacuum device 760 of FIG. 7. By providing vacuum and heating to >135° C., the planar PETg substrate that is originally placed on the mold is deformed to the shape of the mold in two minutes.
Step 2
An 800 Å-thick ITO layer was deposited onto the hemispherical PETg substrate by an ITO sputtering system.
Step 3
A metal strike layer of suitable thickness, i.e. 50 Å-thick Au, was coated on top of the ITO layer using a metal deposition process, specifically electron-beam evaporation. At this point, the substrate and layers deposited thereon looked similar to substrate 710, electrode layer 720 and strike layer 730 of FIG. 7.
Step 4
A metal resist pattern was transferred via stamping to the metal strike layer, using cold welding. Methods for such transfer, albeit in the context of a flat surface, are described in Kim, C., P. E. Burrows, and S. R. Forrest, Science, 288(5467):831-833 (2000). While similar parameters and considerations may be used in the context of a non-planar substrate, some modifications may also be useful. For example, to achieve this step, a PDMS stamp was deformed into a dome shape using a vacuum mold similar in appearance to vacuum device 760. The PETg hemisphere was placed in proximity to the stamp. The vacuum was released, allowing the elastomeric stamp to relax back and contact conformally with the substrate, as illustrated in FIG. 8. A metallic bond is therefore formed between the metal patterns on the stamp and metal strike layer on the substrate. By applying vacuum again, the stamp is removed from the substrate, leaving behind the metal patterns, as illustrated in FIG. 9.
PDMS Stamp Description
A PDMS stamp was replicated from a pre-patterned Si master using methods described previously in Kim, C, and S. R. Forrest, Advanced Materials, 15(6):541-545 (2003). Briefly PDMS perpolymer and a curing agent (SYLGAR 184 Silicone Elastomer Kit, Dow Corning) were mixed in a 10:1 weight ratio. After degassing in a vacuum box for 10 minutes, the mixture was coated onto the Si master by spin casting at 200 rpm for 30 s. The PDMS prepolymer was subsequently cured at 100° C. for one hour. These process conditions yielded a PDMS stamp that was 200-μm thick and could be peeled off from the master. Finally a 200 Å-thick Au layer (metal transfer layer) was deposited onto the patterned PDMS stamp using metal deposition, specifically electron-beam deposition in this example.
Step 5
The 50 Å metal strike layer was removed using a 1-minute Argon plasma (example conditions: 20 mTorr, 30 sccm, 70 W). This removal can be seen in the context of a flat substrate by comparing FIGS. 3 and 4, although the substrate in the current example was curved.
Step 6
The sample was placed in a dilute (0.05 M) oxalic acid for 9 minutes. Due to the selectivity of oxalic acid between ITO and Au, ITO between two Au patterns that was not covered by the metal resist was etched away in oxalic acid. This removal can be seen in the context of a flat substrate by comparing FIGS. 4 and 5. The remaining metal mask was removed in the Au etchant, as can be seen in the context of a flat substrate by comparing FIGS. 5 and 6.

Using this method, 800 Å-thick ITO was successfully patterned on hemispherical PETg substrates. The pattern was 0.3 mm wide with 0.2 mm spacing between two adjacent lines. The measured sheet resistance of the patterned ITO was 200Ω/□, which is compatible with that of sputtered ITO.

Example 2

Example 2 provides an example of a mask, specifically a gold mask, transferred via stamping and used to pattern an underlying layer, specifically an ITO layer, on a flat substrate.

Step 1

An 80 nm ITO layer was sputtered onto a flat and transparent, glycol-modified polyethylene terephthalate (PETg) sheet, followed by a 15 nm Au strike layer that was thermally deposited in vacuum. The structure appeared as illustrated in FIG. 1.

Step 2

Masters composed of Si were patterned with lines of 50 µm feature size using conventional photolithography. A flat PDMS stamp with an array of parallel, 50 µm wide ridges that correspond to the positions of the metal columns on the focal plane array (FPA) were fabricated using a pre-etched Si "master." Techniques for such patterning are described in C. Kim, M. Shtein, S. R. Forrest, Appl. Phys. Lett. 80, 4051(2002); C. Kim and S. R. Forrest, Adv. Mater. 15, 541(2003); X. Xu, M. Davanco, X. Qi, S. R. Forrest, Organic Electronics (2008), DOI: 10.1016/j.orgel.2008.07.011. A curing agent and PDMS prepolymer were thoroughly mixed at a 1:7 weight ratio, followed by degassing for 1 h to remove all air bubbles and to ensure complete mixing. The prepolymer was then poured onto the Si master and cured at 100° C. for 1 h to form a stamp with patterns transferred from the Si master.

Step 3

The stamp was coated with a 20 nm thick Au layer by vacuum thermal evaporation. The stamp appeared as illustrated in FIG. 2.

Step 4

The PDMS stamp was placed in conformal contact with the PETg surface, and a bond was formed between the metal-coated ridges on the stamp and the strike layer. Upon separation of the PDMS stamp from the substrate, the metal stripes were left behind. The transfer of metal stripes, an example of a mask, is illustrated in FIG. 3.

Step 5

The Au strike layer was then removed by sputtering in a 30 sccm, 20 Torr and 100 W Argon plasma etching for 3 minutes, exposing ITO between the lines of the metal mask. This removal of the Au strike layer can be seen by comparing FIGS. 3 and 4.

Step 6

The PETg sheet was placed in a dilute oxalic acid with an acid concentration of 0.05 M for 8 minutes to etch away the ITO stripes that are not covered by the patterned metal mask. More details on such etching are provided in T. H. Tsai, Y. F. Wu, Microelectronic Engineering 83, 536(2006). Due to the high selectivity of oxalic acid to Au and ITO, the ITO covered by stamped metal masks remains untouched. This removal of ITO can be seen by comparing FIGS. 4 and 5.

Step 7

The remaining patterned metal mask was removed in Au etchant, Gold Etchant TFA, available from Transene Company, Inc. of Maine, USA leaving behind ITO stripes duplicating the pattern from metal masks on the flat PETg. This removal of the metal mask can be seen by comparing FIGS. 5 and 6.

The patterned 50 µm wide, 80 nm thick ITO on flat PETg had an edge roughness of <1 µm. The surface roughness of patterned ITO on flat PETg was measured by atomic force microscopy (AFM) to be 6.1±0.5 nm, which is comparable to that of as-sputtered ITO, which was 5.9±0.6 nm, showing that the patterned mask effectively protects the ITO from the Argon plasma bombardment and wet chemistry etching process. The patterned metal stripes had a 355±25 nm edge roughness prior to etching, suggesting that the patterning resolution can reach submicron scale. However, the etching of the 80 nm thick ITO increased the edge roughness to 560±50 nm, possibly due to metal particle residuals built up on the edge during the plasma etching process, which could be resolved by routine adjustments to the plasma etching process. The measured sheet resistance of the patterned ITO was measured to be 200±20Ω/□, ten times higher than that of commercial ITO. This is believed to be due to the absence of an annealing process to avoid damage to the plastic substrate, and it is believed that the sheet resistance could be significantly lowered by using a different substrate material and annealing.

Example 3

Example 3 provides an example of a mask, specifically a gold mask, transferred via stamping and used to pattern an underlying layer, specifically an ITO layer, on a substrate having 2-dimensional curvature. Photodetectors were made using the patterned ITO layers of Example 3.

Step 1

A flat PETg sheet was deformed into a 1 cm radius hemisphere by heating and then drawing it into a vacuum mold, similar to vacuum device 760 of FIG. 7.

Step 2

An 80 nm ITO layer and a 15 nm Au layer were separately coated on the curved PETg sheet.

Step 3

A flat PDMS patterned stamp pre-coated with a 10 nm thick Au layer, was deformed into a hemispherical shape using the same vacuum mold from Step 1, as illustrated in FIG. 7.

Step 4

The spherical PETg substrate was then placed in close proximity to the deformed PDMS stamp by releasing the vacuum holding the PDMS stamp to the vacuum device, as illustrated in FIGS. 7 and 8. When the vacuum was released, the deformed PDMS stamp relaxes back and conformally contacts the PETg substrate, allowing a metallic bond to form between the metal-coated ridges on the stamp and the strike layer.

Step 5

The PDMS stamp was parted from the substrate through re-application of the vacuum, leaving behind the metal stripes, as illustrated in FIGS. 8 and 9.

Step 6

Using same etching steps described for Example 2, ITO stripes were patterned onto the hemispherical surfaces, using the gold transferred via stamping as a mask.

Step 7

Organic layers were deposited, without pattering, over the ITO stripes. Specifically, a 50 nm thick copper phthalocyanine (CuPc) layer, a 50 nm thick $C_{60}$ layer and a 10 nm bathocuproine (BCP) exciton blocking layer were deposited via thermal evaporation, in that order, to form a double heterojunction diode active region. See P. Peumans and S. R. Forrest, Appl. Phys. Lett. 79, 126(2001).

Step 8

An array of 20 nm thick Ag cathode columns, running in a direction perpendicular to the ITO anode rows, was patterned by a similar stamping process on top of the organic layers. FIG. 10 shows a picture of the resultant array of photodetectors, which is a 100 pixel array of 500 µm×500 µm devices on a 1 cm radius PETg hemisphere.

Example 4

A 10,000 pixel (100×100) array of photodetectors was fabricated on a flat focal plane array. The process steps were similar to those described for Example 3, except that the substrate and stamp were flat. Each device was 50 µm×50 µm.

Example 5

An array of control devices was grown by shadow masking on a planar surface, without the use of stamping. The array was similar to that of Example 4 in terms of the number and size of devices, as well as the materials and layer thicknesses used to make the devices.

The performance of the arrays of photodetectors described in Examples 3, 4 and 5 was measured. The results are shown in FIG. 11. The graph shows plots of current density (A/cm$^2$) vs. voltage for a device of each example— triangles for a device in the 100×100 array of devices fabricated with the use of a stamp (Example 4), solid squares for a device in the 10×10 array of devices fabricated with the use of a stamp (Example 3), and circles for a device in the 100×100 array of devices grown with a shadow mask (Example 5) At −1V bias, the dark current density of a photodetector within a passive matrix yielded a total current density of 126.9±0.6 µA/cm$^2$ in a 100×100 planar array (Example 4) and 11.7±0.3 µA/cm$^2$ in a 10×10 hemispherical array (Example 3), which is approximately 100 times and 10 times higher than it of the individual control device, 1.9±0.2 µA/cm$^2$ (Example 5). It is believed that the incremental pixel dark current is due to the accumulated leakage currents from other pixels within the passive matrix. One way to maintain low dark current is to integrating the photodetector with a thin film transistor.

The inset to FIG. 11 shows the measured external quantum efficiency of the devices as a function of wavelength, for the devices of Example 5, i.e., double heterojunction photodiodes consisting of 50 nm thick CuPc layer, 50 nm C60 layer and 10 nm BCP layer based on ITO transparent anodes. The external quantum efficiency (EQE) of the ITO/CuPc/C60/BCP/Ag diode, shown in inset, is peaking at 20.5% at λ=605 nm, with a 65% increase from the detector with semi-transparent Au anodes due to the higher absorption of ITO anodes that is >80% across the visible spectrum 5. The photodetector detectivity $D^*=(A\Delta f)^{1/2}/NEP$, where A is the detector area, $\Delta f$ is the bandwidth, and NEP is the noise equivalent power. Applying reverse bias −1V, NEP is dominated by shot noise, which gives $NEP=(2qI_D)^{1/2}/R(\lambda)$, where q is the electronic charge, $I_D$ is the dark current, and $R(\lambda)$ is the detector responsivity. At λ=605 nm, R=0.10 A/W is obtained. Therefore, $D^*=(A\Delta f)^{1/2}\times R(\lambda)/(2qI_D)^{1/2}$ reaches $1.25\times10^{11}$ cmHz$^{1/2}$ W$^{-1}$ in a 1 Hz bandwidth, higher than previously reported result due to the increase of EQE. See X. Xu, M. Davanco, X. Qi, S. R. Forrest, Organic Electronics (2008), DOI: 10.1016/j.orgel.2008.07.011.

The dark current densities at reverse bias are higher than an isolated individual device due to the accumulated leakage currents from the passive matrix and show a linear dependence on the passive matrix size. The increased absorption through ITO anodes improves external quantum efficiency by 65% to a peaking efficiency 20.5% at 605 nm, compared with the result of a previously demonstrated photodetector array with semi-transparent Au anodes. Therefore, the photodetector detectivity D* that is limited by shot noise at reverse bias, reaches as high as $1.25\times10^{11}$ cmHz$^{1/2}$ W$^{-1}$ in a 1 Hz bandwidth.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A method, comprising:
   providing a first layer over a substrate, the first layer comprising a first material;
   applying a second material to an elastic stamp and placing the elastic stamp applied with the second material over an opening of a vacuum mold having a permeable or semipermeable surface, the surface having generally the same shape as the substrate;
   deforming the elastic stamp applied with the second material to a non-planar shape into an interior of the vacuum mold by applying a vacuum wherein the non-planar shape of the elastic stamp applied with the second material is the shape of the permeable or semipermeable surface;
   positioning the deformed elastic stamp applied with the second material in close proximity to the first layer without contacting the first layer;
   forming a patterned second layer by releasing the vacuum from the vacuum mold, such that the second material contacts the first material via the deformed elastic stamp returning to a relaxed state;
   such that the patterned second layer covers a first portion of the first layer, and does not cover a second portion of the first layer; and
   removing the second portion of the first layer via a subtractive process while the first portion of the first layer is protected from removal by the patterned second layer,
   wherein the second material is a metal.

2. The method of claim 1, wherein the second material is gold.

3. The method of claim 1, wherein the first material is not a metal.

4. The method of claim 1, wherein the first material is a transparent conductive oxide.

5. The method of claim 1, wherein the first material is indium tin oxide.

6. The method of claim 1, wherein the patterned second layer is applied using a PDMS stamp.

7. The method of claim 1, wherein the method is performed at a temperature of 20 C to 30 C.

8. The method of claim 1, wherein the second portion of the first layer is removed via a dry process.

9. The method of claim 1, wherein the stamp includes a plurality of different elastomeric materials having at least one of different elasticity or different hardness from one another.

10. The method of claim 1, wherein the stamp includes at least one of a gradient of elasticity and gradient of hardness.

11. The method of claim 1, wherein the stamp is deformed to include a non-developable curvature.

12. The method of claim 11, further comprising relaxing the non-developable curvature of the stamp to provide substantially conformal contact between the first material and the second material during the stamping.

13. A method, comprising:
   providing a first layer over a substrate, the first layer comprising a first material;
   depositing a strike layer on the first layer;

applying a second material to an elastic stamp and placing the elastic stamp applied with the second material over an opening of a vacuum mold having a permeable or semipermeable surface, the surface having generally the same shape as the substrate;

deforming the elastic stamp applied with the second material to a non-planar shape into an interior of the vacuum mold by applying a vacuum wherein the non-planar shape of the elastic stamp applied with the second material is the shape of the permeable or semipermeable surface;

positioning the deformed elastic stamp applied with the second material in close proximity to the strike layer without contacting the strike layer;

forming a patterned second layer by releasing the vacuum from the vacuum mold, such that the second material contacts the strike layer via the deformed elastic stamp returning to a relaxed state;

such that the patterned second layer covers a first portion of the strike layer, and does not cover a second portion of the strike layer; and removing the second portion of the strike layer via a subtractive process while the first portion of the strike layer is protected from removal by the patterned second layer, wherein the second material is a metal.

14. The method of claim 13, wherein the strike layer comprises the second material.

15. The method of claim 13, further comprising removing portions of the first layer not covered by the patterned second layer after applying the second patterned layer and removing the second portion of the strike layer via a subtractive process.

16. The method of claim 15, further comprising removing the patterned second layer after the second portion of the first layer is removed, such that the first portion of the first layer remains.

17. A method, comprising:
providing a first layer over a substrate, the first layer comprising a first material including a transparent conductive oxide;

depositing a strike layer comprising a metal on the first layer;

applying a second material to an elastic stamp and placing the elastic stamp applied with the second material over an opening of a vacuum mold having a permeable or semipermeable surface, the surface having generally the same shape as the substrate;

deforming the elastic stamp applied with the second material to a non-planar shape into an interior of the vacuum mold by applying a vacuum wherein the non-planar shape of the elastic stamp applied with the second material is the shape of the permeable or semipermeable surface;

positioning the deformed elastic stamp applied with the second material in close proximity to the strike layer without contacting the strike layer;

forming a patterned second layer by releasing the vacuum from the vacuum mold, such that the second material contacts the strike layer via the deformed elastic stamp returning to a relaxed state;

such that the patterned second layer covers a first portion of the strike layer and the first layer, and does not cover a second portion of the strike layer and the first layer;

removing the second portion of the strike layer;

removing the second portion of the first layer via a subtractive process while the first portion of the first layer is protected from removal by the patterned second layer; and removing the patterned second layer after the second portion of the first layer is removed, such that the first portion of the first layer remains, wherein the second material comprises the metal.

18. The method of claim 17, wherein the stamp includes a plurality of different elastomeric materials having at least one of different elasticity or different hardness from one another.

19. The method of claim 17, wherein the stamp includes at least one of a gradient of elasticity and gradient of hardness.

20. The method of claim 17, wherein the stamp is deformed to include a non-developable curvature.

21. The method of claim 20, further comprising relaxing the non-developable curvature of the stamp to provide substantially conformal contact between the strike layer and the second material during the stamping.

22. A method, comprising:
providing a first layer over a non-developable convex surface of a substrate, the first layer comprising a first material;

applying a second material to an elastic stamp and placing the elastic stamp applied with the second material over an opening of a vacuum mold having a permeable or semipermeable surface, the surface having generally the same shape as the substrate;

deforming the elastic stamp applied with the second material to a non-planar shape into an interior of the vacuum mold by applying a vacuum wherein the non-planar shape of the elastic stamp applied with the second material is the shape of the permeable or semi-permeable surface;

positioning the deformed elastic stamp applied with the second material in close proximity to the first layer without contacting the first layer;

forming a patterned second layer by releasing the vacuum from the vacuum mold, such that the second material contacts the first material via the deformed elastic stamp returning to a relaxed state;

such that the patterned second layer covers a first portion of the first layer, and does not cover a second portion of the first layer, and removing the second portion of the first layer via a subtractive process while the first portion of the first layer is protected from removal by the patterned second layer, wherein the second material s a metal, and the first material includes a transparent conductive oxide.

23. The method of claim 22, wherein a thickness of the patterned second layer is less than a thickness of the first layer.

24. The method of claim 22, wherein the first material includes indium tin oxide.

25. The method of claim 22, wherein a ratio of a maximum height of the substrate to a major axis of the substrate is at least 0.1.

26. The method of claim 22, wherein the non-developable surface includes an at least partially elliptical or partially spherical shape.

* * * * *